United States Patent [19]
Suzuki

[11] Patent Number: 5,574,492
[45] Date of Patent: Nov. 12, 1996

[54] IMAGING METHOD AND SEMICONDUCTOR DEVICE MANUFACTURING METHOD USING THE SAME

[75] Inventor: Akiyoshi Suzuki, Tokyo, Japan

[73] Assignee: Canon Kabushiki Kaisha, Tokyo, Japan

[21] Appl. No.: 567,719

[22] Filed: Dec. 5, 1995

Related U.S. Application Data

[63] Continuation of Ser. No. 38,900, Mar. 29, 1993, abandoned.

[30] Foreign Application Priority Data

Mar. 27, 1992 [JP] Japan .................................. 4-071270
Mar. 1, 1993 [JP] Japan .................................. 5-039826

[51] Int. Cl.$^6$ .................................................. R41J 15/16
[52] U.S. Cl. ................................................................ 347/256
[58] Field of Search .................................... 347/134, 256, 347/258, 241, 262, 264

[56] References Cited

U.S. PATENT DOCUMENTS

| | | | |
|---|---|---|---|
| 3,771,872 | 11/1973 | Nightingale et al. | 355/125 |
| 3,795,446 | 3/1974 | Houston | 355/78 |
| 3,887,816 | 6/1975 | Colley | 250/571 |
| 4,159,164 | 6/1979 | Dammann et al. | 350/162 |
| 4,497,015 | 1/1985 | Konno et al. | 362/268 |
| 4,521,082 | 6/1985 | Suzuki et al. | 350/405 |
| 4,547,037 | 10/1985 | Case | 350/3.75 |
| 4,634,240 | 1/1987 | Suzuki et al. | 350/508 |
| 4,641,035 | 2/1987 | Suzuki et al. | 250/548 |
| 4,645,924 | 2/1987 | Suzuki et al. | 250/236 |
| 4,668,089 | 5/1987 | Oshida et al. | 356/152 |
| 4,834,540 | 5/1989 | Totsuka et al. | 356/401 |
| 4,853,756 | 8/1989 | Matsuki | 355/71 |
| 4,895,780 | 1/1990 | Nissan-Cohen et al. | 430/5 |
| 4,924,257 | 5/1990 | Jain | 355/53 |
| 4,931,830 | 6/1990 | Suwa et al. | 355/71 |
| 4,947,413 | 9/1990 | Jewell et al. | 378/34 |
| 4,988,188 | 1/1991 | Ohta | 353/122 |
| 5,061,956 | 10/1991 | Takubo et al. | 355/55 |
| 5,118,957 | 6/1992 | Kawashima et al. | 250/561 |
| 5,144,362 | 9/1992 | Kamon et al. | 355/53 |
| 5,153,773 | 10/1992 | Muraki et al. | 359/619 |
| 5,194,345 | 3/1993 | Rolfson | 430/5 |
| 5,208,629 | 5/1993 | Matsuo et al. | 355/53 |
| 5,229,255 | 7/1993 | White | 430/311 |
| 5,242,770 | 10/1993 | Chen et al. | 430/5 |

(List continued on next page.)

FOREIGN PATENT DOCUMENTS

| | | |
|---|---|---|
| 0293643 | 12/1988 | European Pat. Off. . |
| 0346844 | 12/1989 | European Pat. Off. . |
| 0437376 | 7/1991 | European Pat. Off. . |
| 0486316 | 5/1992 | European Pat. Off. . |
| 1579159 | 7/1969 | France . |
| 2835363 | 3/1980 | Germany . |
| 3933308 | 5/1990 | Germany . |
| 57-62052 | 4/1982 | Japan . |
| 61-41150 | 2/1986 | Japan . |
| 1227151 | 4/1971 | United Kingdom . |

OTHER PUBLICATIONS

Fukuda, et al., "Nikkei Microdevices," 1990 Jul. Edition, pp. 108–114.
Noguchi, et al., "Subhalf Micron Lithography System With Phase–Shifting Effect," Optical/Laser Microlithography V, vol. 1674, Mar. 1992, pp. 92 through 104.

*Primary Examiner*—Mark J. Reinhart
*Attorney, Agent, or Firm*—Fitzpatrick, Cella, Harper & Scinto

[57] ABSTRACT

A method of imaging a fine pattern having a group of lines extending along orthogonal first and second directions and a group of lines extending along a third direction different from the first and second directions includes illuminating the pattern obliquely, to form an image of the line pattern. Illumination beams along the first, second and third directions, respectively, each has an intensity sufficiently lowered as compared with that of a particular illumination beam along a particular direction different from the first, second and third directions.

54 Claims, 17 Drawing Sheets

U.S. PATENT DOCUMENTS

| | | | |
|---|---|---|---|
| 5,248,575 | 9/1993 | Ogoshi | 430/5 |
| 5,275,894 | 1/1994 | Tanabe | 430/5 |
| 5,300,378 | 4/1994 | Minami | 430/5 |
| 5,305,054 | 4/1994 | Suzuki et al. | 355/53 |
| 5,352,550 | 10/1994 | Okamoto | 430/5 |
| 5,357,311 | 10/1994 | Shiraishi | 355/53 |
| 5,367,404 | 11/1994 | Hayata | 359/558 |
| 5,418,093 | 5/1995 | Asai et al. | 430/5 |

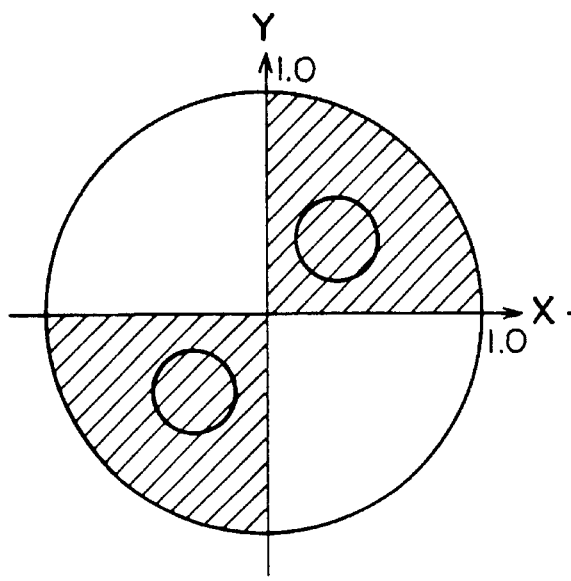
F I G. 13A
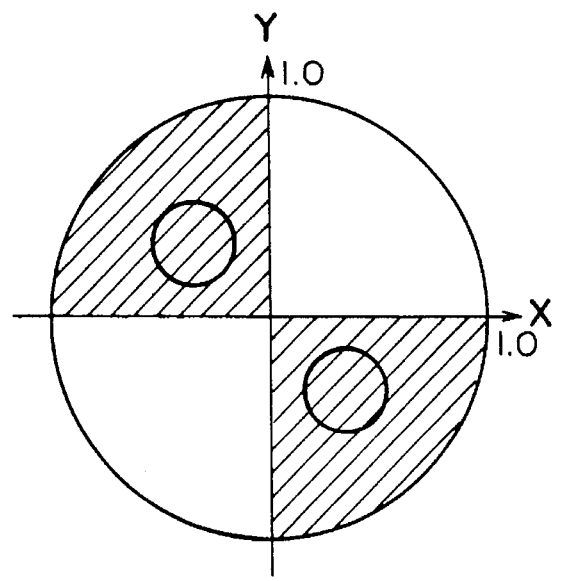
F I G. 13B
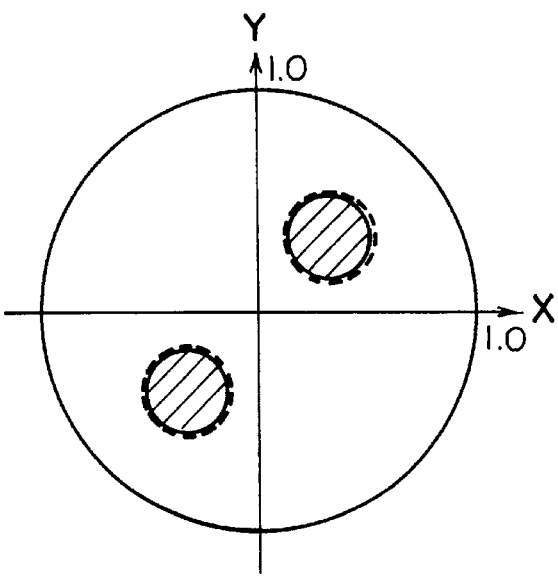
F I G. 13C
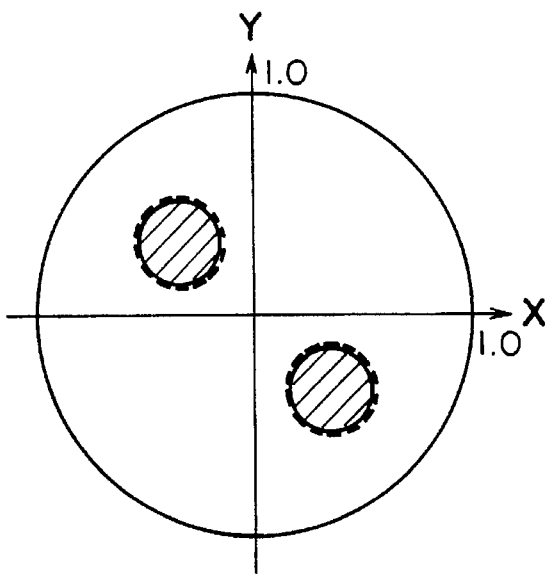
F I G. 13D

IMAGING METHOD AND SEMICONDUCTOR DEVICE MANUFACTURING METHOD USING THE SAME

This application is a continuation of prior application Ser. No. 08/038,900 filed Mar. 29, 1993, now abandoned.

FIELD OF THE INVENTION AND RELATED ART

This invention relates to an imaging method and a semiconductor device manufacturing method using the same. More particularly, the invention is concerned with such a method suitably applicable to a projection exposure apparatus for manufacturing devices such as memory devices (e.g., semiconductor memories), image pickup devices (e.g., CCDs), display devices (e.g., LCDs), and thin film magnetic heads.

Semiconductor technology has advanced more and more and, along with that, fine processing techniques have advanced considerably. Particularly, a projection exposure technique which is the major one of the fine processing techniques has entered a submicron region, with the development of 1 mega DRAM.

A conventionally used method of improving the resolution in the projection exposure technique, is to increase the numerical aperture (NA) of a projection optical system while maintaining the exposure wavelength fixed. However, as it is known that the depth of focus of a projection optical system is in an inverse proportion to the NA, increasing the NA causes a serious problem in relation to the depth of focus. In consideration of this, attempts have been made to reduce this problem and to extend the limit of projection exposure techniques by shortening the exposure wavelength, e.g., from g-line to i-line or from i-line to KrF laser light (248.4 nm).

Separate from these attempts, as phase shift film method has been proposed to improve the resolution. According to this method, a thin film is formed in a portion of a conventional type reticle (mask) so as to apply a phase shift of 180 deg. relative to the remaining portion of the reticle (as discussed in the paper by Fukuda et al, "Nikkei Microdevices", July 1990, from page 108).

Generally, the resolution RP and the depth of focus DOF of a projection optical system can be expressed as:

$$RP = k_1 \lambda / NA$$

$$DOF = k_2 \lambda / NA^2$$

wherein $\lambda$ is the exposure wavelength, and NA is the numerical aperture. A practical numerical value of the parameter $k_1$ is usually in the range of 0.7–0.8. It is known that, where a spatial frequency modulation type phase shift film is used according to the phase shift film method, the resolution can be improved to about $k_1 = 0.35$.

However, there remain some problems in relation to the spatial frequency modulation type phase shift method. Examples are as follows:

1) Unestablished techniques for forming a phase shift film:
2) Unestablished development of optimum CAD for a phase shift film:
3) Existence of a pattern to which a phase shift film cannot be applied:
4) A requirement of using a negative type resist, in relation to Item 3): and
5) Unestablished techniques for inspection and correction.

On the other hand, studies have recently been made to improve the method of illuminating a fine pattern of a reticle to enhance the resolution in the imaging of the fine pattern.

SUMMARY OF THE INVENTION

In accordance with a first aspect of the present invention, there is provided an imaging method, usable for device manufacture, for example, for imaging a fine pattern having a group of lines extending along orthogonal first and second directions and a group of lines extending along an oblique third direction different from the first and second directions, by illuminating the pattern obliquely, the method having an improvement which resides in that the intensity of illumination along planes of incidence including the first, second and third directions, respectively, is sufficiently lowered as compared with the intensity of illumination in another plane of incidence.

In this first aspect of the present invention, the intensity of illumination along the planes of incidence including the first to third directions may be reduced substantially to zero. The third direction may have an azimuth of 45 deg. and illumination light may be projected along a pair of light paths which are symmetric with each other with respect to a plane of incidence including the third direction and which define a plane of incidence perpendicular to the plane of incidence including the third direction.

In accordance with a second aspect of the present invention, there is provided an exposure apparatus, comprising: a first stage for carrying thereon an original; a second stage for carrying thereon a substrate and being movable in orthogonal X and Y directions; means for obliquely illuminating a fine pattern of the original; and means for imaging on the substrate the fine pattern illuminated by said illuminating means; wherein said illuminating means includes light limiting means for sufficiently lowering the intensity of illumination along planes of incidence, including the X and Y directions and a direction with an azimuth of 45 deg. with respect to the X and Y directions, as compared with the intensity of illumination along another plane of incidence.

In the second aspect of the present invention, the light limiting means may serve to reduce, substantially to zero, the intensity of illumination along a plane of incidence including a direction of azimuth of 45 deg. with respect to the X and Y directions. The light limiting means may include light blocking means having two openings which are symmetric with each other with respect to an optical axis.

In accordance with a third aspect of the present invention, there is provided an imaging method usable for device manufacture, for example, for imaging a fine pattern having a group of lines extending along orthogonal first and second directions by illuminating the pattern obliquely, wherein the improvement resides in that the intensity of illumination along planes of incidence including the first and second directions, respectively, is sufficiently lowered as compared with the intensity of illumination in another plane of incidence, such that the intensity of a zeroth order diffraction beam produced by the fine pattern is attenuated and such that the zeroth order diffraction beam and a first order diffraction beam also produced by the fine pattern have substantially the same intensity.

In the third aspect of the present invention, the intensity of illumination along the planes of incidence including the first and second directions, respectively, may be lowered substantially to zero. Illumination light may be projected along a pair of light paths which are symmetric with each other with respect to a plane of incidence including one direction of azimuth of 45 deg. with respect to the first and second directions and which define a plane of incidence perpendicular to the plane of incidence including the one direction. Further, through the illumination with illumination light projected along the pair of light paths, the intensity of zeroth order diffraction light produced by the fine pattern may be attenuated.

In these aspects of the present invention, the imaging characteristic to a particular pattern such as described above can be improved significantly. However, the invention is not limited to the imaging of such a particular pattern, but is applicable to the imaging of a fine pattern which includes a pattern of relatively large linewidth in addition to the particular pattern.

The term "oblique illumination" means the manner of illumination in which an illumination beam is projected (obliquely) upon a fine pattern along a direction which is inclined with respect to a normal to the surface on which the fine pattern is formed. Thus, the term "plane of incidence" in this case means the plane which contains the direction of projection of the illumination beam as well as the normal to the surface on which the fine pattern is formed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are schematic views for explaining light quantity distribution upon a pupil, wherein FIG. 2A shows a light quantity distribution in a case where a conventional reticle is illuminated perpendicularly and FIG. 2B shows light quantity distribution in a case where a spatial frequency modulation type phase shift reticle is illuminated perpendicularly.

FIGS. 5A–5C are schematic views for explaining the relationship between illumination light and imaging light in a case of oblique illumination, wherein FIG. 5A shows the illumination light and imaging light, FIG. 5B shows the range of illumination light suitable for the imaging of a fine pattern having longitudinal and transverse lines, and FIG. 5C shows the range of illumination light suitable for the imaging of a fine pattern having lines inclined by ±45 deg.

FIGS. 6A and 6B are schematic views for explaining an effective light source to be formed in accordance with the present invention, wherein FIG. 6A shows the range of an effective light source (illumination light) suitable for the imaging of a fine pattern having longitudinal and transverse lines as well as lines inclined by −45 deg., and FIG. 6B shows the range of an effective light source (illumination light) suitable for the imaging of a fine pattern having longitudinal and transverse lines and lines inclined by +45 deg.

FIGS. 13A–13D are schematic views for explaining the combination of an effective light source and an attenuation filter for a pupil, wherein FIG. 13A shows an example of a filter to be used with the effective light source of FIG. 6A, FIG. 13B shows an example of a filter to be used with the effective light source of FIG. 6B, FIG. 13C shows another example of a filter to be used with the effective light source of FIG. 6A, and FIG. 13D shows another example of a filter to be used with the effective light source of FIG. 6B.

FIGS. 16A and 16B are schematic views for explaining the structure of an attenuation filter to be added to the pupil, wherein FIG. 16A shows a cemented wedge type filter and FIG. 16B shows reflection light caused by the cemented wedge type filter.

DESCRIPTION OF THE PREFERRED EMBODIMENTS

For a better understanding of the present invention, the imaging which is based on the spatial frequency modulation type phase shift method will first be explained.

Figure 1:
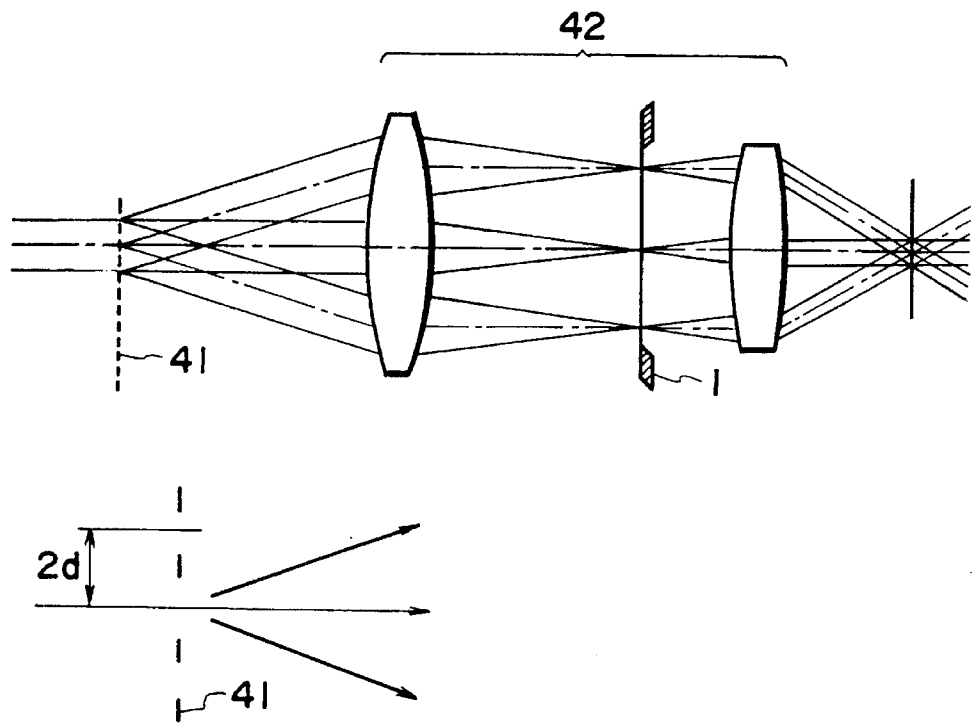
FIG. 1 is a schematic view for explaining the imaging of a pattern.
Figures 2A, 2B:
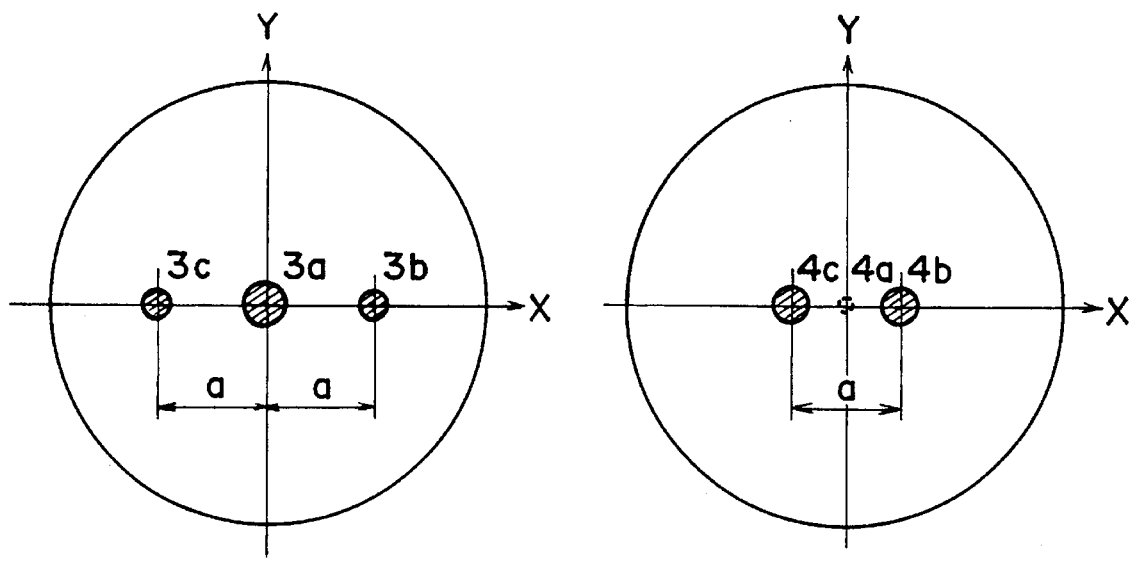

FIG. 1 is a schematic view for explaining the imaging of a fine pattern. Denoted at 41 is a fine pattern. Denoted at 42 is a projection optical system. Denoted at 1 is a stop of the projection optical system. The apertured surface of the stop 1 can be considered as being a pupil of the projection optical system 42. In the system of FIG. 1, illumination light is incident on the fine pattern 41 to be imaged, and various diffraction lights produced by the fine pattern 41 enter the projection optical system 42 (stop 1 thereof) by which the fine pattern 41 is imaged. FIGS. 2A and 2B are schematic views of light quantity distribution at the pupil position where, in the system of FIG. 1 the illumination light is incident perpendicularly upon the fine pattern 41. FIG. 2A corresponds to a case of a pattern of a conventional reticle and FIG. 2B corresponds to a case of a pattern of a spatial frequency modulation type phase shift reticle. In FIGS. 2A and 2B, denoted at 3a (4a) is the distribution of zeroth order (diffraction) light. Denoted at 3b (4b) is the distribution of positive first order (diffraction) light, and denoted at 3c (4c) is the distribution of negative first order (diffraction) light. In the case of the pattern of the spatial frequency modulation type phase shift reticle, it is to be noted that at the pupil position the zeroth order light 4a is extinguished and only the first order lights 4b and 4c are present. From this, it is seen that there are provided advantageous effects at the pupil position (spatial frequency plane) in the imaging of a pattern of a spatial frequency modulation type phase shift reticle: that is, (1) the frequency is reduced to a half; and (2) no zeroth order light is included in the frequency distribution. These two points are to be noted first. Second, it is to be noted that the spacing a at the pupil position between the positive and negative first order lights caused by the pattern of a spatial frequency modulation type phase shift reticle is equal to the spacing a at the pupil position between the zeroth order light and the positive or negative first order light caused by the pattern of a conventional reticle. Also, it is to be noted that the amplitude ratio of the positive and negative first order lights is 1:1 in the case of a spatial frequency modulation type phase shift reticle; whereas the amplitude ratio of the zeroth order light and the positive or negative first order light is $1:2/\lambda$ in the case of a conventional type reticle.

Figure 3:
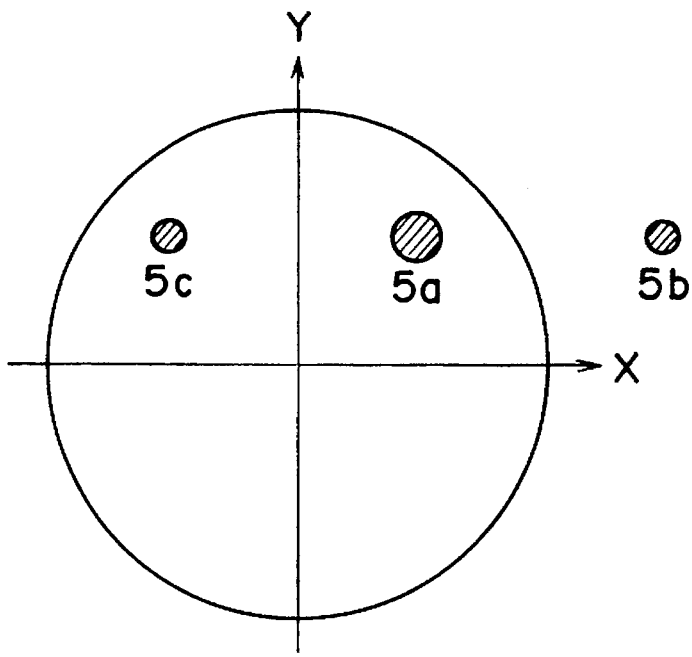
FIG. 3 is a schematic view for explaining light quantity distribution on a pupil in a case where a conventional type reticle is illuminated obliquely.

In accordance with the present invention, on the other hand, illumination light is incident obliquely upon a fine pattern of, e.g., a reticle (oblique illumination) by which a light quantity distribution (frequency distribution), analogous to the pattern to be formed by applying a spatial frequency modulation type phase shift method to a conventional pattern, is formed at the pupil position of a projection optical system. FIG. 3 shows such a light quantity distribution at the pupil position, formed when a pattern is illuminated obliquely. This pattern comprises repetitions (lines and spaces) of a pattern (longitudinal line pattern) extending in a longitudinal direction (Y direction). For oblique illumination, zeroth order light 5a is deviated from the center of the pupil, and there are first order diffraction light 5b and negative first order diffraction light $-5b$ at the opposite sides of the zeroth order light 5a. When the radius of the pupil is standardized to 1 and if the linewidth of the pattern having regularly arrayed light transmitting portions and light blocking portions is $k_1\lambda/NA$ ($\lambda$ is the wavelength and NA is the numerical aperture of the projection optical system), then the spacing a on the pupil plane between the zeroth order light and the positive or negative first order light is given by:

$$a = \tfrac{1}{2}k_1$$

Therefore, if $k_1=0.5$, then $a=1$ and the zeroth order light 5a and the positive or negative first order light 5b or 5c are spaced by a distance corresponding to the radius of the pupil. The fact that the amount of a is large means that, when the illumination light is incident obliquely, in addition to the zeroth order light, only one of the positive and negative first order diffraction lights is incident on the pupil of the projection optical system. Here, comparison will be made in the point of distribution of diffraction light on the pupil plane, to a case where illumination light is incident perpendicularly upon the conventional type reticle pattern of FIG. 2A, a case where illumination light is incident perpendicularly upon the spatial frequency modulation type phase shift reticle pattern of FIG. 2B, and a case where illumination light is incident obliquely upon the conventional type reticle pattern of FIG. 3. Particularly, in the case of FIG. 3, it is assumed that the pattern is illuminated obliquely so that the zeroth order light impinges on the pupil plane at the position of coordinates $x=0.5$ and $y=0.5$, and that $k_1=0.5$ is set. As regards the distribution of diffraction light on the pupil plane in the cases of FIGS. 2B and 3, while the distributions are relatively deviated in the longitudinal direction, they are equivalent to each other in the point that only two lights pass through the pupil. The feature that only two lights pass through the pupil is quite distinguished from the case of FIG. 2A wherein three lights pass through the pupil. This means that the oblique illumination method described with reference to FIG. 3 assures, to a conventional pattern, substantially the same advantageous results as attainable with the spatial frequency modulation type phase shift method described with reference to FIG. 2B.

In practicing the oblique illumination method, the linewidth best suited to a longitudinal pattern (pattern extending in the Y direction) is that by which the positions of the zeroth order light 5a and negative first order light 5c become symmetric with each other with respect to the Y axis of X-Y coordinates that corresponds to the direction along which the longitudinal pattern extends. Thus, when the oblique illumination is to be done, the angle of incidence of the illumination light may be determined in accordance with the minimum linewidth of a pattern to be imaged.

Figure 4:
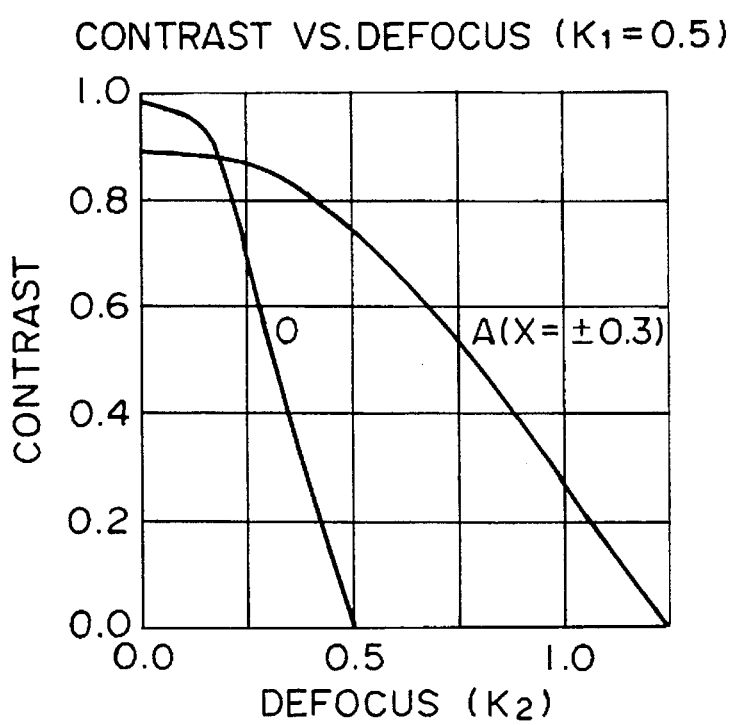
FIG. 4 is a graph for explaining the contrast vs. defocus characteristic in the imaging, in a case where a conventional reticle is illuminated perpendicularly and a case where the same is illuminated obliquely.

Further, as long as a conventional type pattern is to be imaged, in the case of oblique illumination the zeroth order light and first order light have different intensities on the pupil plane and, therefore, exactly the same result with the spatial frequency modulation type phase shift method is not attainable. Calculating the results of both cases on the basis of the intensity ratio of a pair of lights passing through the pupil, it is seen that on a condition of best focus the contrast of the image of a pattern in the case where a conventional pattern is illuminated obliquely reduces by about 10% as compared with the image of a pattern in the case where a pattern of a spatial frequency modulation type phase shift reticle is imaged. The peak contrast of the focus vs. contrast curve is 100% in the case of the pattern of the spatial frequency modulation type phase shift reticle of FIG. 2B; whereas it is 91% in the case of the oblique illumination method of FIG. 3. FIG. 4 shows focus vs. contrast curves, on condition of the $k_1=0.5$, in the case of the imaging based on the oblique illumination method and in the case of the imaging based on conventional perpendicular illumination. The axis of abscissa corresponds to the parameter $k_2$ of the depth of focus, and the position of the zeroth order light upon the pupil in the cases of oblique illumination is $\pm 0.3$ (x coordinates of the pupil). In the case of perpendicular illumination, the contrast is as high as 97% if the defocus is zero, but it decreases quickly with an increase of defocus. In the case of an oblique illumination method, while the contrast as the defocus is zero is 91% which is slightly lower as compared with the case of perpendicular illumination, it decreases gradually with the increase of defocus. Thus, it is seen that the oblique illumination method is superior to the conventional method, in the point of defocus characteristic.

Generally, an integrated circuit pattern is composed mainly of a group of longitudinal lines and a group of transverse lines extending in orthogonal directions, and this tendency becomes stronger with a recent further increase in the degree of integration. The X axis and Y axis of the coordinates of the pupil such as illustrated in FIGS. 2–4 correspond to the longitudinal and transverse directions of the longitudinal line group and transverse line group, respectively. Since the oblique illumination method does provide an advantageous effect in the imaging of a fine pattern as has been described with reference to FIG. 4, if only such a light component of the illumination light that is contributable to the effect of the oblique illumination is selected and used, it is possible to considerably enlarge the depth of focus for the imaging of a fine pattern of a linewidth of about $k_1=0.5$, for example.

Figure 5A:
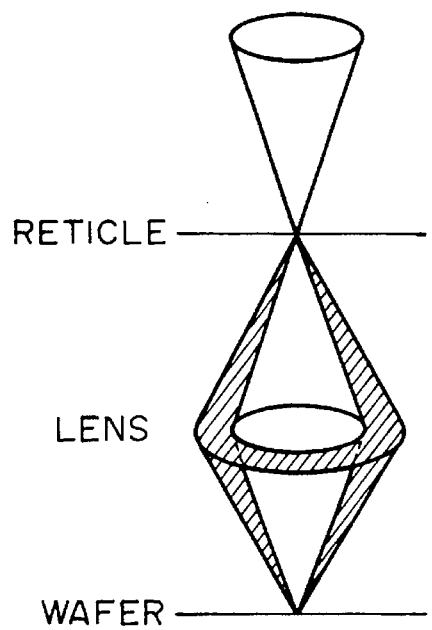
Figure 5B:
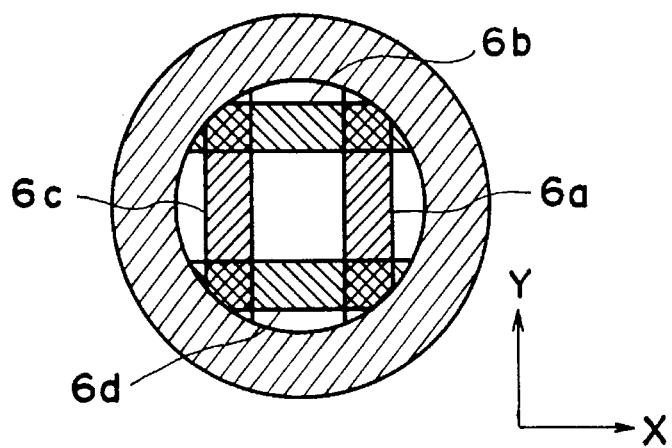
Figure 5C:
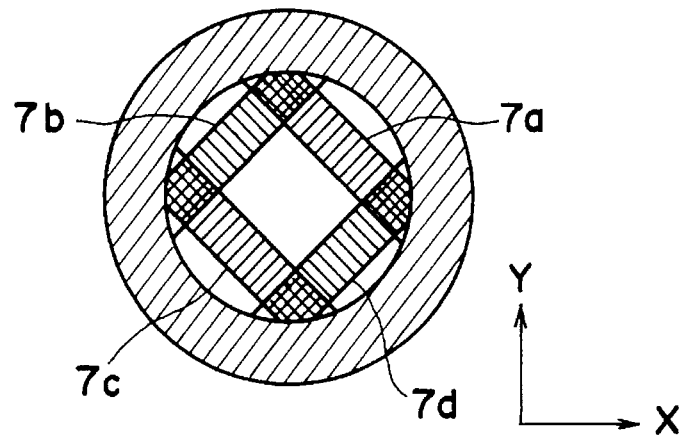

FIGS. 5A–5C are schematic views for explaining the difference in the zeroth order light on the pupil. Of the drawings, FIG. 5A shows the relationship between the illumination light and the imaging light as taken by a projection optical system. Generally, in a projection exposure apparatus for manufacture of semiconductor devices, the expansion of light of an illumination optical system is smaller than the expansion of light passing through a projection optical system. The degree of such expansion can be observed at the pupil position of the projection optical system, and FIG. 5B shows this in an enlarged view. An out side circle in FIG. 5B corresponds to the expansion of imaging light, and an inside circle depicts the expansion of illumination light. In FIG. 5B, reference characters 6a and 6c denote portions of illumination light which are contributable to provide illumination with a large depth of focus (illumination which assures a large depth of focus in the imaging) to a fine pattern extending in the longitudinal direction (Y direction); while reference characters 6b and 6d denote portions of illumination light which are contributable to provide illumination with a large depth of focus to a fine pattern extending in the transverse direction (X direction). Overlapping common portions at four corners serve to provide illumination with a large depth of focus to a fine pattern extending in both of the longitudinal and transverse directions (X and Y directions). On the other hand, in some cases, an integrated circuit pattern includes a fine pattern extending along an oblique direction, in addition to longitudinal and transverse patterns. Of course, it is desirable to provide illumination of a large depth of focus to such an integrated circuit pattern. FIG. 5C illustrates a distribution of illumination light that provides a large depth of focus to an oblique fine pattern, not a longitudinal or transverse pattern, which extends in the direction of ±45 deg. (an angle with respect to the X or Y direction). In FIG. 5C, reference characters 7a and 7c denote regions of illumination light which serve to provide a large depth of focus to an oblique pattern of −45 deg. direction; while reference characters 7b and 7d denote regions of illumination light which serve to provide a large depth of focus to an oblique pattern of +45 deg. direction. Overlapping common portions of these regions correspond to the common portions of FIG. 5B as rotated by 45 deg. about the center of the pupil. Thus, while it is not possible to satisfy the longitudinal and transverse fine patterns and oblique fine patterns of −45 deg. and +45 deg. directions concurrently, if the pattern to be imaged is composed of a combination of longitudinal and transverse patterns and an oblique pattern extending in one oblique direction (such as in a case where it is composed of two types of fine patterns extending in longitudinal and transverse directions and an oblique fine pattern extending in the −45 deg. direction, or a case where it is composed of two types of fine patterns extending in longitudinal and transverse directions and an oblique fine pattern extending in the +45 deg. direction), it is possible that common portions of the illumination light can provide a large depth of focus.

Figure 6A:
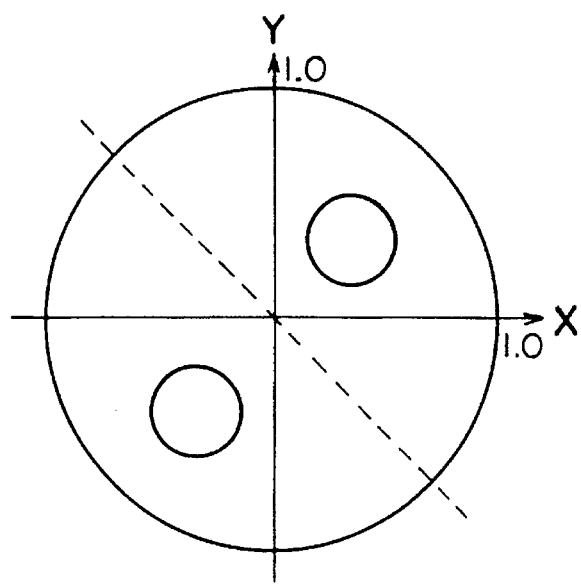

FIG. 6A shows an example of effective light source defined in accordance with a first preferred form of the imaging method of the present invention. This effective light source is defined on the pupil by zeroth order light of the illumination light by which a fine pattern is illuminated obliquely. When observed macroscopically, this effective light source comprises two regions: which are present in the first and third quadrants of the X-Y coordinates of the pupil, respectively; which are along the +45 deg. direction from the pupil center, with respect to the X and Y axes; and which are symmetrical with each other with respect to the pupil center (0, 0). In this embodiment, the centers of the first and third quadrants have coordinates of (0.35, 0.35) and (−0.35, −0.35), respectively, and both of these quadrants have a radius of 0.2. This is so when observed macroscopically. If observed microscopically, each region which can be observed as a single region when observed macroscopically can be seen as a combination of configurations corresponding to the shapes of small lenses of an optical integrator of the illumination optical system. In accordance with the imaging method which uses light to be formed by the effective light source shown in FIG. 6A, the depth of focus characteristic can be improved considerably to a group of transverse lines and a group of longitudinal lines extending along the X and Y axes as well as to a group of the oblique lines of −45 deg. direction (direction of broken line), perpendicular to the direction along which the effective light source is present.

Figure 6B:
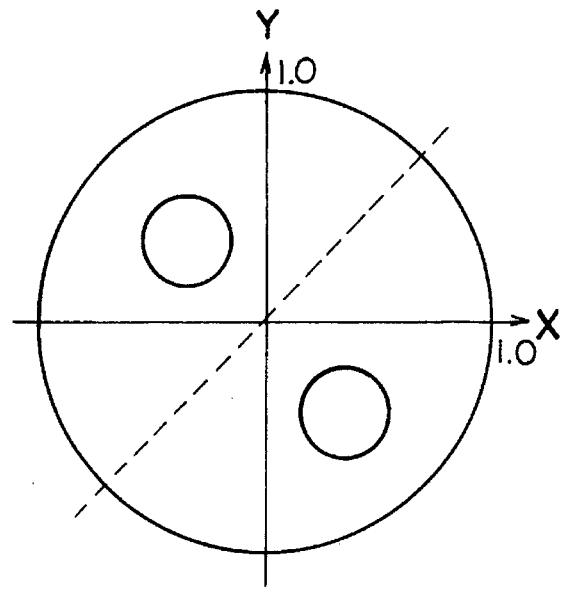

FIG. 6B shows another example of an effective light source defined in accordance with the first preferred form of the imaging method of the present invention. This effective light source is defined on the pupil by zeroth order light of the illumination light by which a fine pattern is illuminated obliquely. When observed macroscopically, this effective light source comprises two regions: which are present in the second and fourth quadrants of the X-Y coordinates of the pupil, respectively; which are along the −45 deg. direction from the pupil center, with respect to the X and Y axes; and which are symmetrical with each other with respect to the pupil center (0, 0). In this embodiment, the centers of the second and fourth quadrants have coordinates of (−0.35, 0.35) and (0.35, −0.35), respectively, and both of these quadrants have a radius of 0.2. In accordance with the imaging method which uses light to be formed by the effective light source shown in FIG. 6B, the depth of focus characteristic can be improved considerably to a group of transverse lines and a group of longitudinal lines extending along the X and Y axes as well as to a group of oblique lines of the +45 deg. direction (direction of the broken line), perpendicular to the direction along which the effective light source is present.

In each of FIGS. 6A and 6B, the distribution of zeroth order light upon the pupil of the projection optical system is shown as an effective light source. For defining such an effective light source, a light source (secondary light source) having a light quantity distribution such as shown in FIG. 6A or 6B may be formed on a plane within an illumination optical system for illuminating a fine pattern, which plane is conjugate with the pupil plane of a projection optical system. Two lights from the formed light source may be used to illuminate the fine pattern obliquely. The directions of X and Y axes of X-Y coordinates on an occasion when the position at which the optical axis extends through this plane is taken as an origin, are so set that they correspond to the directions of X and Y axes of the X-Y coordinates of the pupil of the projection optical system. Namely, they correspond to the directions along which the longitudinal and transverse lines of the fine pattern, to be illuminated, extend. Thus, the light quantity distribution on this plane is so set that, as compared with the illumination along a plane of incidence including a direction perpendicular to the direction of elongation of an oblique line among oblique lines of +45 deg. and −45 deg. directions and longitudinal and transverse lines, all constituting a fine pattern, the illumination along another plane of incidence is sufficiently weak. Preferably, the intensity of illumination along the other plane is set to be substantially equal to zero, such that only the two lights advancing along a pair of light paths which are symmetrical with each other with respect to the plane of incidence including the direction of elongation of the oblique line and which are within a plane of incidence substantially perpendicular to the above plane of incidence, can illuminate the fine pattern.

Figure 7:
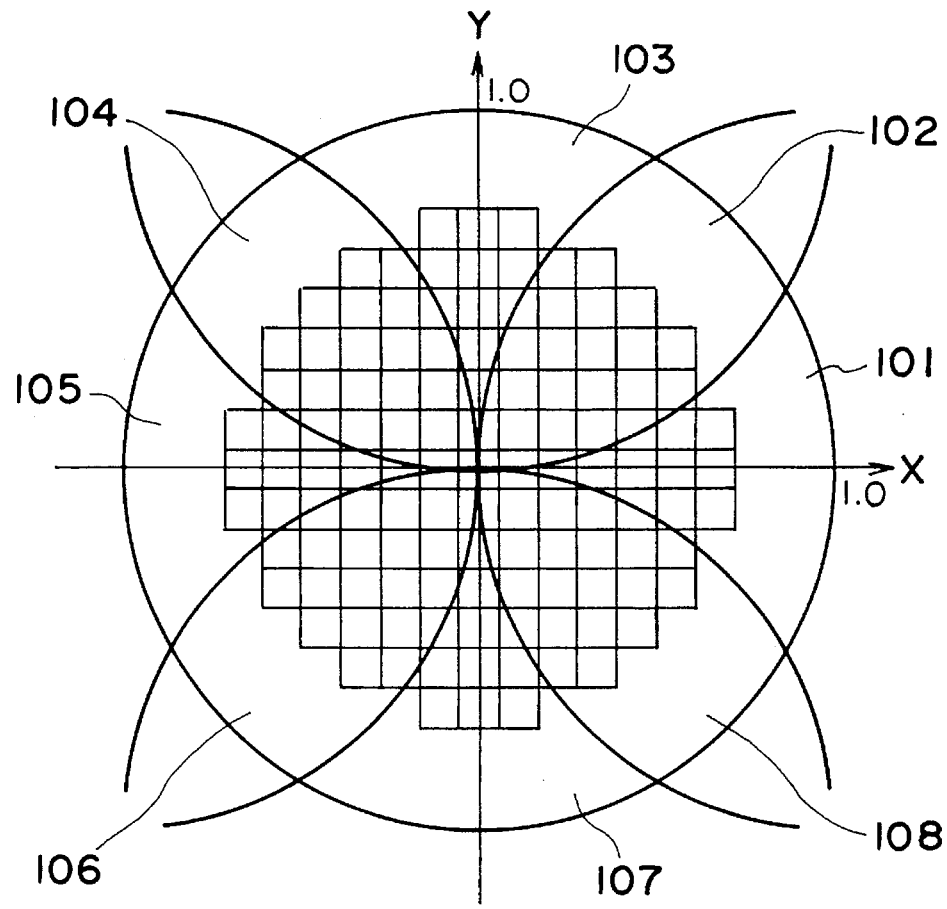
FIG. 7 is a schematic view for explaining the manner of selecting disposition of an effective light source.

Now, the position and size of each portion of the effective light source will be explained with reference to FIG. 7. It is assumed that, when the directions with respect to which a high resolution is required for an integrated circuit pattern are X and Y directions, a circle that represents the pupil 1 of the projection optical system 42 (FIG. 1) having a radius 1 is the one as defined by:

$$x^2+y^2=1$$

Here, the following four circles are considered:

$$(x-1)^2+y^2=1$$

$$x^2+(y-1)^2=1$$

$$(x+1)^2+y^2=1$$

$$x^2+(y+1)^2=1$$

These four circles represent deviation of a pupil due to diffraction light in the imaging where $k_1=0.5$. While actually the center positions of these four circles change depending on the linewidth of the pattern and also the value of $k_1$ is variable, here $k_1=0.5$ is taken as an example. By these four circles, the circle that represents the pupil can be divided into eight regions 101–108. The illumination of high resolution and large depth of focus to groups of longitudinal and transverse lines extending along X and Y directions, can be provided by selecting portions of small lenses of an optical integrator (to be described later) corresponding to the even-numbered regions 102, 104, 106 and 108 of the eight regions so that light is projected with priority to these regions 102, 104, 106 and 108. On the other hand, since the position of best defocus characteristic corresponding to the linewidth of $k_1$ is expressed by $x=\frac{1}{4}k_1$ to a pattern extending, e.g., in the Y direction, the X coordinate is 0.5 to the linewidth of about $k_1=0.5$. Thus, actually the X and Y coordinates of the centers of each region of the effective light source are $0.25 \leq |x|$, $|y| \leq 0.6$, such that those small lenses which are present in this range and which are present within the region 102, 104, 106 or 108 may be selected. Further, the radius r of each region may be preferably set to be in the range of $0.15 \leq r \leq 0.30$. While the linewidth which is to be the subject of optimization is about $k_1=0.5$ to 0.8, also in such a case the position of the effective light source can be determined by defining four overlapping circles such as shown in FIG. 7.

As described, in accordance with one essential feature of the present invention, the effective light source has a light quantity distribution which is weighted on the pupil plane along the +45 deg. or −45 deg. direction. However, the shape of each portion of the effective light source is not limited to square or circular, but many other shapes may be used. While the shape is not determined specifically since it is directly concerned with the shape of the optical integrator, it is sufficient that a distribution such as shown in this embodiment is defined equivalently.

Now, an exposure apparatus having an illumination optical system for forming an effective light source such as described with reference to FIG. 6A or 6B, will be explained.

Figure 8:
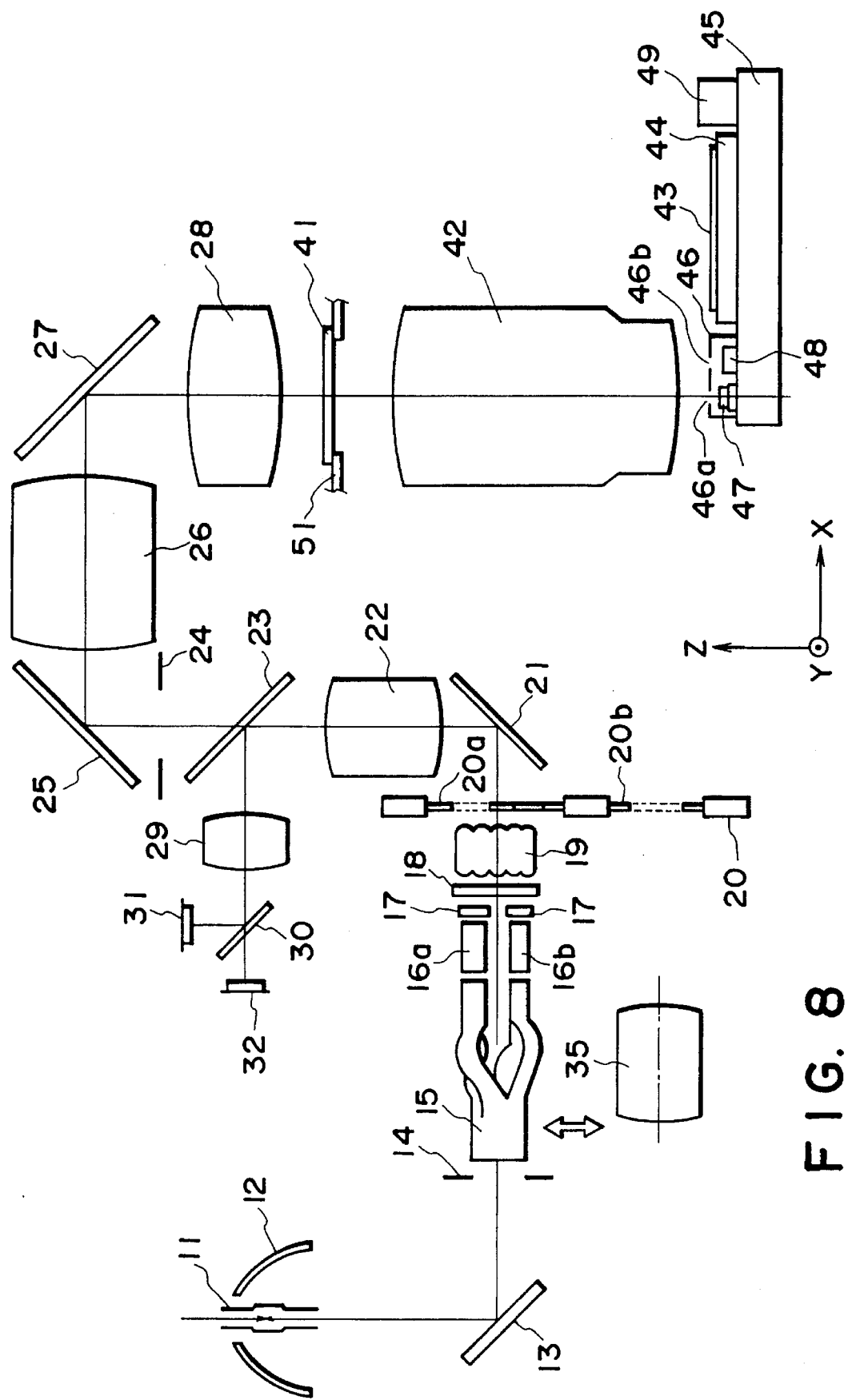
FIG. 8 is a schematic view of an example of a projection exposure apparatus which is based on an imaging method of the present invention.

FIG. 8 is a schematic view of a semiconductor device manufacturing projection exposure apparatus, wherein an image of a circuit pattern is projected in accordance with the imaging method of the present invention.

In FIG. 8, light from a super high pressure Hg lamp 11 having its arc disposed at a first focal point position of an elliptical mirror 12 is reflected by the elliptical mirror 12 and is collected at a position adjacent to a second focal point position of the elliptical mirror 12, whereby an arc image is formed at that position. Light from the second focal point position of the elliptical mirror 12 is reflected by a deflecting mirror 13 and, if a shutter 14 is open, it impinges on a fiber bundle 15 disposed after the shutter 14. The fiber bundle 15 has four branched exit ports, and the fiber bundle 15 serves to receive the light, from the mirror 13, at its single entrance port and to project the received light from its four exit ports. Four optical rods 16 each functioning as a uniformer are disposed in series to the four exit ports of the fiber bundle 15, respectively, such that a non-uniform light intensity distribution at each exit port of the fiber bundle is transformed into a uniform light intensity distribution at the exit port of the corresponding optical rod 16. The positions of the exit ports of the optical rods 16 are determined so that they correspond to respective portions that constitute an effective light source.

In the present invention, it is important that the portions (two portions in this example) of the effective light source are symmetric with each other with respect to the origin of the X-Y coordinates of the pupil plane and that the portions of the effective light source have a substantially even intensity ratio. For example, if the intensity ratio of two portions of the effective light source shown in FIG. 6A or 6B is unbalanced beyond 5%, there arises a problem of distortion of image in the defocused state. In the present embodiment, in consideration thereof, adjusting members 17 for adjusting the relative intensity ratio of the effective light source are disposed after the optical rods 16 so as to assure a substantially even intensity ratio. The adjusting member may comprise an ND filter or an interference filter of a tilt angle adjustable type, for example. The light from the optical rods 16 having the relative intensity ratio adjusted by the adjusting members 17, goes through a wavelength selecting interference filter 18 which serves to select only the necessary wavelength component or components (e.g. g-line or i-line) out of the wavelength components of the super high pressure Hg lamp 11. Then, the light enters an optical integrator 19.

In the unique illumination method of the present invention, a large depth of focus and a high resolution are attainable in the range of very small linewidth, as compared with the conventional illumination method. However, the intensity of illumination light becomes lower. Thus, it is a possible selection to change the characteristic of the wavelength selecting filter 18 between a case where the conventional illumination method is to be used and a case where the illumination method of the present invention is to be used.

Conventionally, a major factor which determines the characteristic of a wavelength selecting filter is the effect of defocus due to chromatic aberration of a projection optical system. Since, however, the defocus characteristic is improved by the illumination method of the present invention, naturally the bandwidth allowed is enlarged correspondingly. As a result, it is possible to use a filter of a large half width as compared with that to be used in the conventional illumination method. Thus, by changing the wavelength selecting characteristic (half width) of the filter 18 to one having a larger half width, in response to the selection of the illumination method of the present invention, it is possible to reduce the loss of light quantity.

Figure 9:
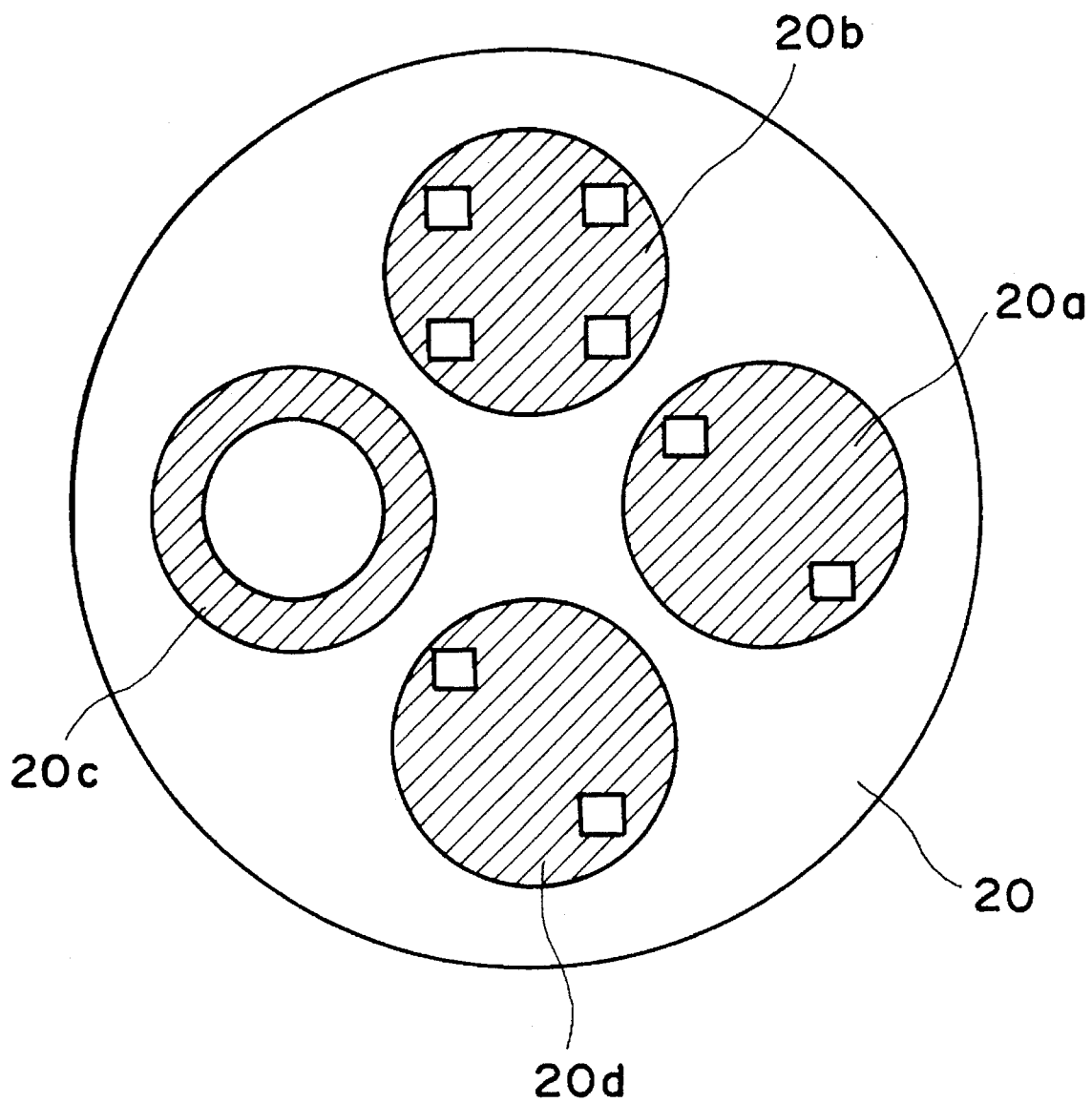
FIG. 9 is a schematic view of an effective light source selecting member 20 of FIG. 8.

Light passing through the optical integrator 19 enters an adjusting member 20 for adjusting the shape of the effective light source. The adjusting member 20 serves to select appropriate ones of the small lenses of the optical integrator 19 to be used for the illumination, in accordance with the sectional shape of the small lenses of the integrator 19. More specifically, it serves to define an effective light source having two or four portions such as shown in FIG. 6A or 6B, or an effective light source of conventional type which is composed of a single light source placed on the optical axis. The position of the adjusting member 20 (or its aperture) is conjugate with the position of the stop of the projection optical system 42 (i.e., the pupil), and the secondary light source is defined at this position. The adjusting member 20 may be disposed between the interference filter 18 and the optical integrator 19. On that occasion, the position of the projection optical system 42 (i.e., the pupil) and the light exit plane of the optical integrator may be disposed substantially in a conjugate relation, and the secondary light source may be defined on the light exit plane. As shown in FIG. 9, the adjusting member 20 has formed therein four different stops 20a–20d each being able to be selectively placed on the light path in response to rotation of the adjusting member 20 through an unshown driving mechanism. Non-painted areas in the stops of FIG. 9 depict openings.

Relay optical system 35 is provided to change the condition for illumination to the optical integrator 19 in accordance with the linewidth of a pattern of a reticle used. This is because in actual processes highest resolution is required only in about one-third of the total processes and, in the remaining processes, the conventional illumination method may be used. In order to define a conventional illumination system, the structural portion from the fiber bundle 15 to the optical rods 16 may be demounted and the relay optical system 35 may be inserted in place thereof. Additionally, the shape selecting member 20 may be replaced by a conventional type stop member 20c. By this, a conventional illumination system is defined. This interchanging may be done automatically by using an unshown driving system.

Denoted at 21 is a deflecting mirror, and denoted at 22 is a lens system. The lens system 22 plays an important role for controlling uniformness of illumination to the reticle. Light passed through the aperture of the adjusting member 20 is reflected by the mirror 21 and, after passing the lens system 22, it is projected on a half mirror 23. The half mirror 23 transmits most of received light and reflects a portion thereof. The light reflected by the half mirror 23 goes through a lens 29 and it is divided by a half mirror 30 into two light beams. These two light beams are directed to corresponding detectors of two photoelectric detectors 31 and 32, respectively. The photoelectric detector 31 comprises a sensor array such as a CCD array for monitoring the shape of distribution of the effective light source, and the adjustment through the relative intensity ratio adjusting member 17 is done on the basis of an output signal of the photoelectric detector 31. On the other hand, the photoelectric detector 32 comprises a sensor of what can be called an integration exposure meter, for monitoring the amount of exposure of a wafer. The opening/closing of the shutter 14 is controlled in accordance with the output of the photoelectric detector 32, whereby the amount of exposure of the wafer is controlled. The half mirror 30 may be replaced by an ordinary mirror which may be selectively driven to direct light to the photoelectric detector 31 for the adjustment through the adjusting member 17 and to direct light to the photoelectric detector for the exposure operation.

Light passing through the half mirror 23 illuminates the aperture of a blade 24, uniformly. The blade 24 comprises four movable light blocking plates for effecting what can be called "masking". In accordance with the size of the integrated circuit pattern area of a reticle to be exposed, the positions of the movable blocking plates are adjusted by an unshown driving system, whereby a window corresponding to the size of the integrated circuit pattern area is defined by the edges of the four light blocking plates. Denoted at 25 is a mirror, and denoted at 26 is a lens system. Denoted at 27 is another mirror, and denoted at 28 is another lens system. Through these components, the light from the window of the blade 24 uniformly illuminate a reticle 41 placed on a reticle stage 51. The window of the blade 24 and the patterned surface of the reticle 41 are disposed in a conjugate relationship with each other, with the intervention of these components.

Denoted at 42 is a projection optical system by which the circuit pattern of the reticle 41 is projected and imaged on a wafer 43 such that the image of the circuit pattern is printed on a resist of the wafer 43. The projection optical system 42 comprises a reduction projection lens system. The wafer 43 is held by a wafer chuck 44, through attraction. The wafer chuck 44 is mounted on an X-Y stage 45 whose position in two directions (X and Y directions) orthogonal to the optical axis of the projection optical system can be controlled by using laser interferometers (not shown). The X-Y stage has a leveling function and/or a focusing function with respect to the direction (Z direction) of the optical axis of the projection optical system 42. Denoted at 49 is a mirror to be used with the laser interferometer, and this mirror is fixedly mounted on the wafer stage 45. The X and Y directions along which the X-Y stage 45 is movable, correspond to the directions of longitudinal and transverse patterns of the reticle 41 and also they correspond to the X and Y axes of the X-Y coordinates of the pupil of the projection optical system 42 (see FIG. 7).

Denoted at 46 is a photoelectric detection unit which is mounted on the X-Y stage 45. The unit has a light receiving surface in which pinholes 46a and 46b are formed. Photoelectric detectors 47 and 48 are provided in association with the pinholes 46a and 46b, respectively. The photoelectric detector 47 serves to measure the quantity of light passing through the pinhole 46a, for measurement of non-uniformness of illumination, for example. On the other hand, the photoelectric detector 48 is associated with the pinhole 46b. It comprises a sensor array such as a CCD array, for measuring the shape of an effective light source as actually defined on the pupil plane of the projection optical system 42. The intensity ratio adjusting member 17 may execute the adjustment while the output of the photoelectric detector 48 is monitored. Also, the output of the detector 48 may be used to calibrate the output of the photoelectric detector 31 of the illumination optical system, which detector is the element for monitoring the shape of the effective light source.

FIG. 9 shows an effective light source selecting member 20 which serves as a stop member for selecting necessary small lenses of the optical integrator 19 to define a desired effective light source. Since each small lens of the optical integrator has a square sectional shape, each opening of the stop member also has a square shape. While each small lens may have a hexagonal or rectangular shape, in some cases, the essential concept may be applied to them.

As described hereinbefore, the X-Y coordinates shown in FIG. 6 correspond to the X and Y directions which are major directions used in designing an integrated circuit pattern. Namely, the coordinates correspond to the directions of longitudinal and transverse line groups of the reticle 41. Also, it may be so considered that the directions of X and Y axes (X and Y directions) substantially correspond to the longitudinal and transverse directions of the outer configuration of the reticle 41 which also has a square shape.

Figure 10A:
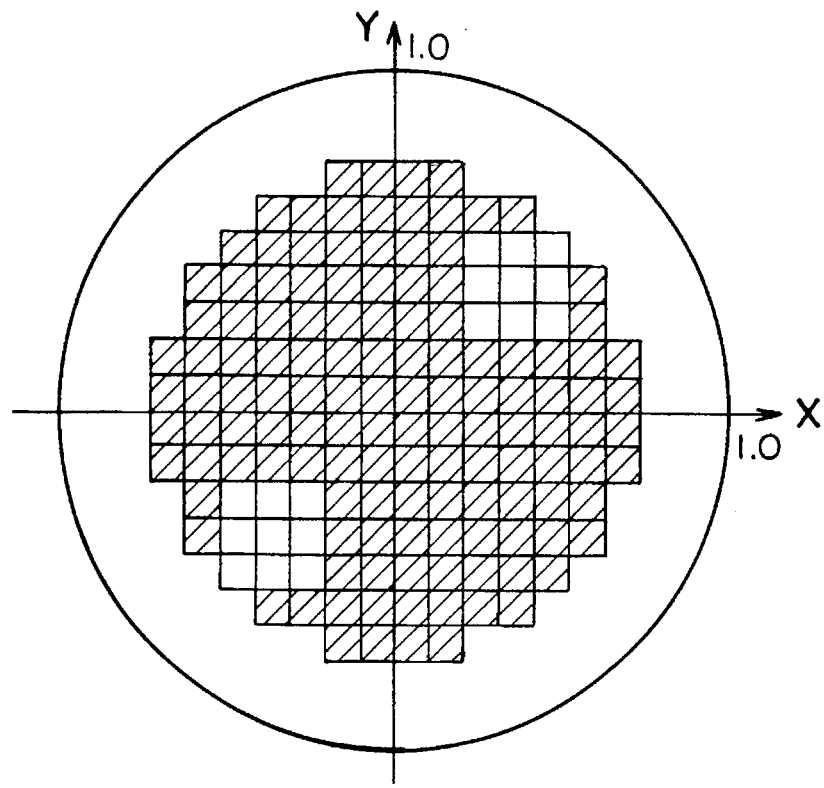
FIGS. 10A and 10B are schematic views for explaining the overlap between an optical integrator and the stop of the effective light source selecting member 20.
Figure 10B:
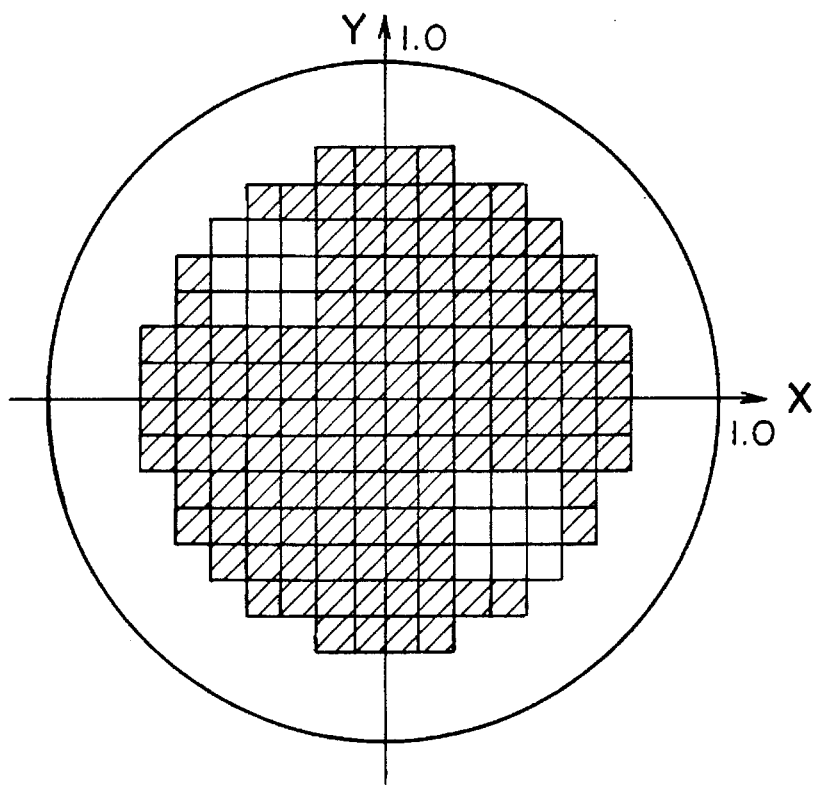

FIGS. 10A and 10B show examples of overlapping of stop 20a (20b) of the effective light source selecting member 20 with the optical integrator 19. The outside circle represents the pupil of the projection optical system 42. Square groups illustrated within the pupil denote the small lenses of the optical integrator 19. When a certain effective light source distribution is going to be defined, there is a limitation by the shape of the optical integrator. For example, if the optical integrator 19 is composed of a predetermined number of small lenses of square shape such as shown in FIG. 10A or 10B, in order to provide an effective light source such as shown in FIG. 6A or 6B, the painted area of FIG. 10A or 10B should be a light blocking area. Namely, in the selection of small lenses, to provide the FIG. 6A example, the FIG. 10A example has to be defined; and to provide the FIG. 6B example, the FIG. 10B example has to be defined.

When in the projection exposure apparatus of this embodiment the stops 20a and 20b of the effective light source selecting member 20 are selected to illuminate the circuit pattern of the reticle 41, a secondary light source having a light quantity distribution such as shown in FIG. 6A or 6B is defined at the position of the stop of the effective light source selecting member 20, which position is conjugate with the pupil of the projection optical system 42, and thus the circuit pattern of the reticle 41 is illuminated with the light from this secondary light source. The directions of X and Y axes of X-Y coordinates having its origin taken on the point whereat the optical axis extends through the plane of the secondary light source, correspond to the directions of the X and Y axes of the X-Y coordinates of the pupil of the projection optical system 42. Namely, the X and Y axes of the X-Y coordinates of the plane on which the secondary light source is defined, correspond to the directions of longitudinal and transverse line groups of the circuit pattern of the reticle 41. Since this secondary light source has a light quantity distribution with highest level portions at two sites (dual peaks), along a direction perpendicular to the direction of elongation of an oblique line (other than longitudinal and transverse lines), extending in the +45 deg. or −45 deg. direction, the lights from these two sites of the effective light source advance along a pair of light paths which are symmetric with each other with respect to the plane of incidence that contains the direction along which the oblique line group of the reticle 41 extends, and finally they illuminate the reticle 41 obliquely. With this illumination, as described, the fine circuit pattern of the reticle 41 (having longitudinal and transverse lines and oblique lines of +45 deg. or −45 deg.) can be imaged upon the wafer 43 through high resolution. It is to be noted that these two lights (zeroth order lights of them) define an effective light source such as shown in FIG. 6A or 6B at the position of the pupil of the projection optical system 42 (or the position of stop).

For high-resolution illumination, it may be advantageous to use a larger diameter portion of the optical integrator 19, beyond the size required in the conventional illumination method. For example, while in the conventional illumination method use of small lenses within a range of radius 0.5 (in terms of a pupil) is preferable, in the high-resolution illumination, it may be preferable to use even those small lenses in a circle of a largest radius of about 0.8 (although those small lenses at a central portion are not used). Thus, the size of the optical integrator 19 as well as the effective diameter of the other portions of the illumination optical system should preferably be determined beforehand in consideration of both of the conventional illumination and high-resolution illumination.

By determining the parameters (such as stops) of the illumination optical system to be selected, while taking into account the specificness (linewidth and direction) of an integrated circuit pattern to be imaged, it is possible to provide an optimum optical arrangement best suited to the pattern. The parameter selection of the illumination optical system may be done automatically by a computer (not shown) which controls the operation of the projection exposure apparatus as a whole.

A problem may arise in relation to the selection of the stop of the member 20: that is, there are cases wherein the illuminance distribution on the pattern forming surface of the reticle 41 changes in response to the selection. On such an occasion, the lens system 22 may be adjusted to finely adjust the non-uniformness in illuminance. For this fine adjustment of the non-uniform illuminance, the spacing between adjacent lenses of the lens system 22 in the direction of the optical axis may be adjusted. Alternatively, the whole or a portion of the lens system 22 may be replaced by other lens elements. On that occasion, plural lens systems each corresponding to the lens system 22 may be prepared beforehand, and they may be used interchangeably in a turret system in response to the selection of the member 20. In order to define the effective light source of FIG. 6A or 6B exactly and also to make it possible to define the conventional illumination system in addition to the high resolution illumination system, the optical integrator 19 may be changed in shape in accordance with the illumination condition therefor.

Figure 11:
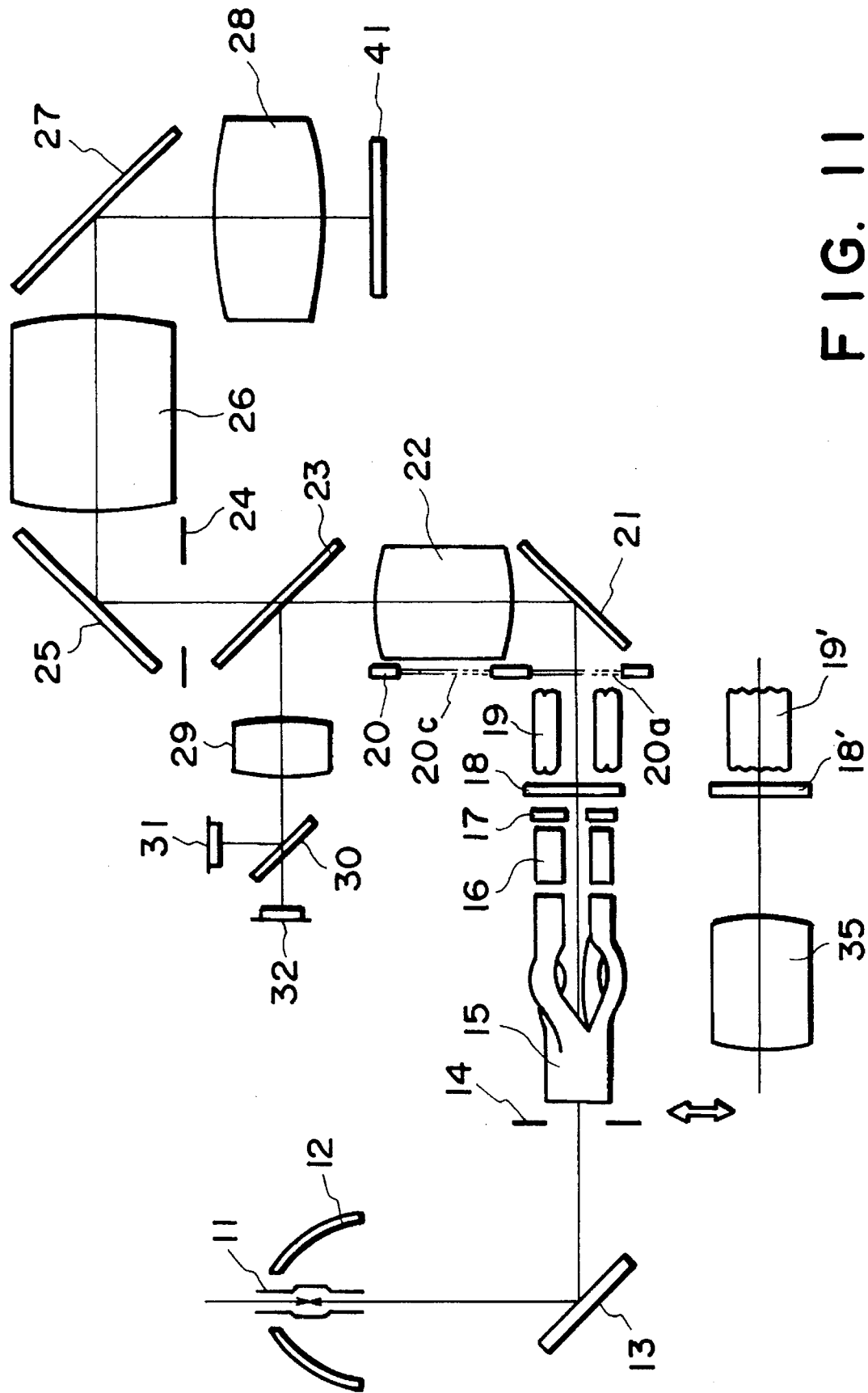
FIG. 11 is a schematic view of a modified form of the FIG. 8 apparatus.

FIG. 11 shows a modified form of the projection exposure apparatus of the FIG. 8 example. Like numerals as those of the FIG. 8 apparatus are assigned to corresponding elements. While in FIG. 11 the portion following the reticle 41 is not illustrated, this portion is of the same structure as that of the FIG. 8 apparatus. The FIG. 11 apparatus differs from the FIG. 8 apparatus in that the interchange of illumination conditions is made mainly by replacement of the optical integrator. This allows enlarged tolerance with respect to the placement of small lenses of the optical integrator. This is illustrated in FIG. 11, wherein the optical integrator 19 has four separate groups of small lenses. Like the FIG. 8 apparatus, each optical rod 16 is associated with a plurality of small lenses of the optical integrator 19. Among those small lenses which are associated with one and the same optical rod 16, uniform illuminance is defined. This contributes to making uniform overlapping of the effective light source. In this example, the interchangeable system (35, 18', 19') includes a filter 18' having a narrower half width, which is different from the interference filter 18 of the dual-peak system of the present invention.

Figure 12:
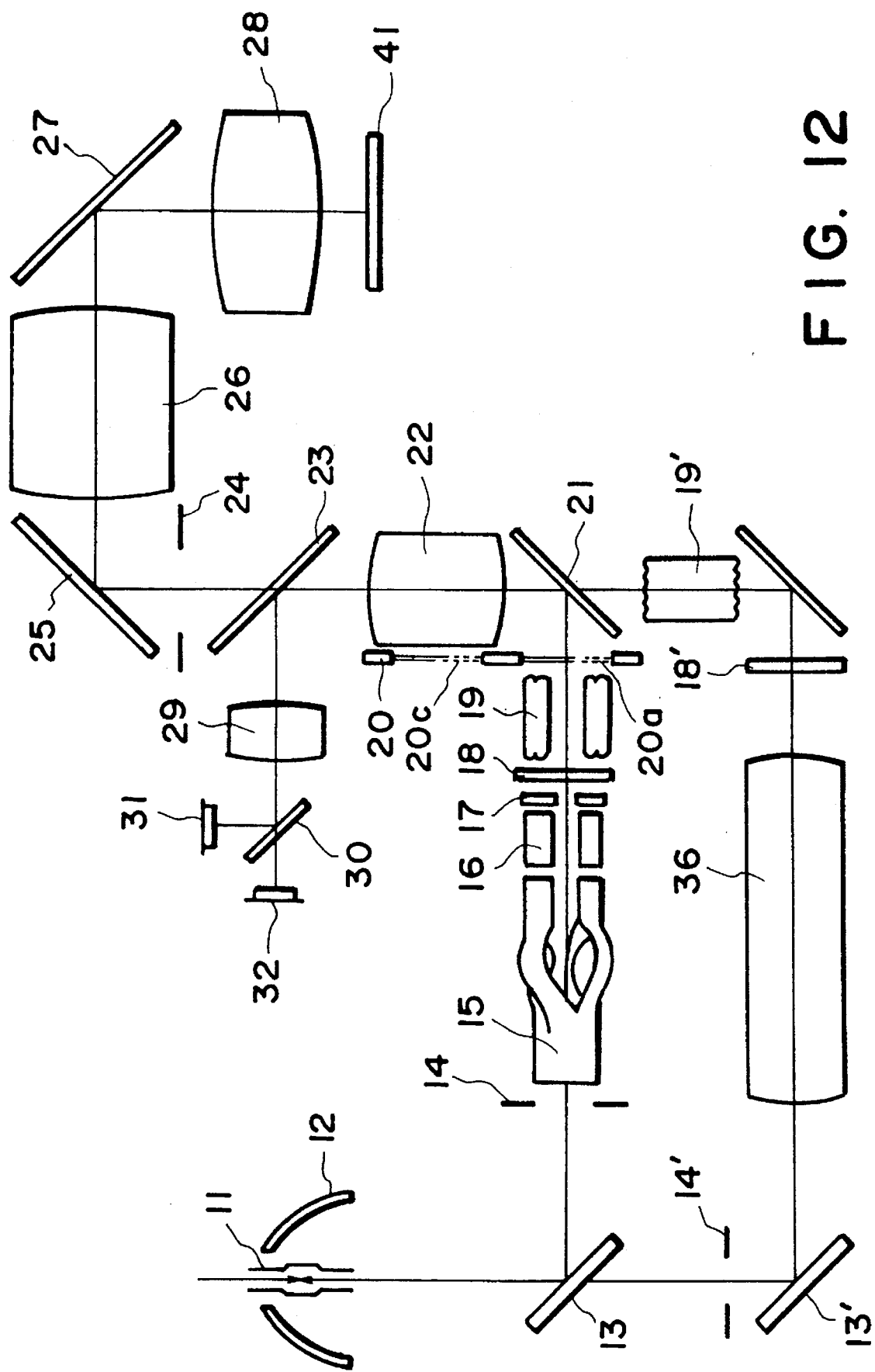
FIG. 12 is a schematic view of a modified form of the FIG. 11 apparatus.

FIG. 12 shows a modified form of the projection exposure apparatus of FIG. 11. Like numerals as those of FIG. 11 are assigned to corresponding elements. The FIG. 12 apparatus differs from the FIG. 11 apparatus in that, rather than interchanging some elements of the illumination optical system, dual-line light paths are defined in the illumination optical system, which light paths are used selectively. The upper light path in FIG. 12 is to be used with a high resolution illumination system, and the lower light path is to be used with an ordinary illumination system for a process wherein only a resolution of more than $k_1=1.0$ is required. Mirrors 13 and 21 in the drawing are interchangeable, such that, the upper light path is selected when the mirrors 13 and 21 are at the illustrated positions; whereas the lower light path is selected when the mirrors are demounted. The mounting and demounting of the mirrors 13 and 21 may be made automatically by means of a driving mechanism, not shown. The member 36 on the lower light path is a relay optical system.

The projection exposure apparatus such as described above includes a single super high pressure Hg lamp of well-known type. However, plural light sources may be used in the present invention. For example, in the apparatus of FIG. 12, separate light sources may be used for the interchangeable upper and lower light paths.

The present invention is applicable also to a case where an excimer laser is used as a light source. When an illumination system includes an excimer laser, in place of using a fiber bundle, a scanning system may be used to scan the optical integrator with a laser light. When the range of scan is controlled by using a known type scanning means, it is easy to provide an effective light source such as shown in FIG. 6A or 6B.

Further, the position of the effective light source selecting member 20 may be separate from the optical integrator. For example, the member is able to function as a stop even if it is placed at a position within the illumination optical system, which position is away from the optical integrator and which is conjugate with the pupil of the projection optical system.

Moreover, an edge emphasis type phase shift reticle may be applied to the projection exposure apparatus as described above.

Next, a second preferred form of the imaging method of the present invention will be explained.

In the imaging method which defines an effective light source having two portions (dual peaks) along the 45 deg. direction with respect to the X-Y coordinates of the pupil, as described with reference to FIGS. 6A and 6B, contrast decrease occurs at the best focus state. This is because the amplitude ratio between the zeroth order light and ± first order light is $1:2/\pi$.

In this embodiment, in consideration thereof, means is provided to attenuate the zeroth order light, which means is disposed at the position on the pupil whereat the zeroth order light passes, so as to provide a ratio of 1:1 between the zeroth order light and ± first order light from a pattern having longitudinal and transverse lines (groups of lines extending along the X and Y axes of the X-Y coordinates).

Figure 14:
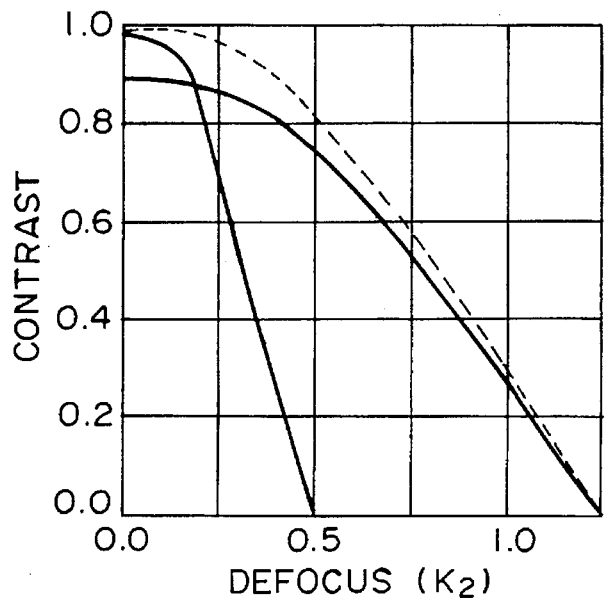
FIG. 14 is a graph for explaining the contrast vs. defocus characteristic in a case where the imaging is based on the combination of a dual-center type effective light source with an attenuation filter for a pupil.

In order to attenuate the zeroth order light, here an attenuation filter such as shown in FIGS. 13A–13D is inserted to the position of the pupil of the projection optical system to thereby attenuate the zeroth order light. FIGS. 13A–13D each illustrates the relation between the effective light source (zeroth order light) and the attenuation filter at the pupil position, wherein FIGS. 13A and 13C show that the effective light source of FIG. 6A is attenuated by attenuation filters as depicted by hatching. FIGS. 13B and 13D show that the effective light source of FIG. 6B is attenuated by attenuation filters as depicted by hatching. Whether the filters of FIGS. 13A and 13C or the filters of FIGS. 13B and 13D is to be selected, is determined by the orientation of the oblique pattern. If a fine pattern to be imaged does not include any oblique pattern, any combination of filters of FIGS. 13A–13D with the effective light source is possible. Each hatched area in the drawings depicts a region having an amplitude transmissivity of $2/\pi$ ($4/\pi$ in terms of intensity transmissivity), and each blank area depicts a region having a transmissivity of 1. With this arrangement, the ratio between the zeroth order light and the ± first order light becomes even and, also, the focus vs. contrast curve (oblique illumination curve) in which the contrast is 91% at a non-defocus state is multiplied by 100/91 in the direction of the axis of the ordinate whereby the contrast at the non-defocus state becomes 100%. Thus, a larger depth of focus is attainable. FIG. 14 shows this. That is, the case of FIG. 14 is under the same condition as that the FIG. 4 example, and the result of insertion of the filter to the pupil of the projection optical system 42 is depicted by a broken line. As regards the degree of attenuation of the zeroth order light, if the attenuation becomes up to $16/\pi^4$ in terms of intensity transmissivity, it is equivalent to non-attenuation. Thus, preferably in terms of intensity transmissivity it is within the range of 20% to 90%.

It is to be noted here that the provision of attenuation filters of FIG. 13A–13D owes to the advantageous result peculiar to the dual-peak type effective light source of FIG. 6A or 6B. While the dual-peak type effective light source lacks one symmetry (with respect to the X and Y axes) as compared with a quad-peak type effective light source, it can be said that such a lack of symmetry enables the provision of attenuation filters.

Figure 15:
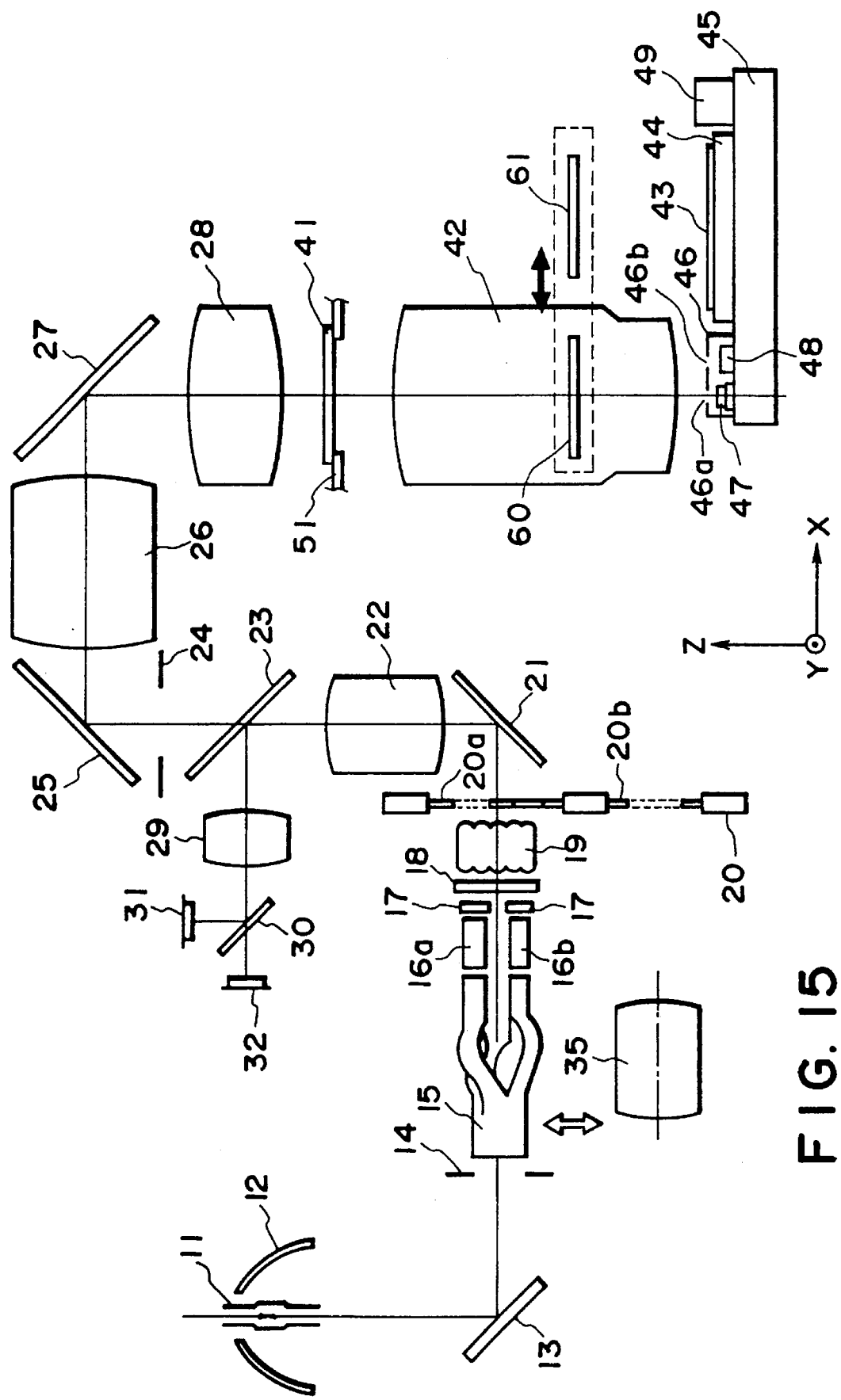
FIG. 15 is a schematic view of an example where an attenuation filter is added to the projection exposure apparatus of FIG. 8.

FIG. 15 shows a further embodiment of a semiconductor device manufacturing projection exposure apparatus which is arranged to project an image of a circuit pattern in accordance with the imaging method of the present invention. This projection exposure apparatus is so structured as to provide the illumination and filtering by which a dual-peak type effective light source (FIG. 13A–13D) is defined. Except for the filtering function, the apparatus of FIG. 15 is essentially of the same structure as that of the apparatuses of FIGS. 8–10. Thus, further explanation will be omitted by assigning the same reference numerals to corresponding elements.

In this projection exposure apparatus, an attenuation filter 60 is demountably inserted to the pupil position of the projection optical system 42. In this embodiment, for imaging the circuit pattern of the reticle 41, the attenuation filter 60 provides essentially the same function as that of a parallel flat plate. The transmissivity characteristic of the filter 60 is such as has been described with reference to FIGS. 13A–13D. When the filter 60 is demounted from the pupil position of the projection optical system 42, a parallel flat plate 61 having the same thickness as the filter 60, being made of the same material as the filter 60 and having the same optical property except for the transmissivity, is inserted to the pupil position of the projection optical system. The plate 61 is placed in the projection optical system 42 unless a dual-peak type effective light source such as described with reference to FIGS. 6–10 is to be defined. While in FIG. 15 the filter 60 comprises a single filter which is interchangeable, preferably a plurality of filters may be prepared beforehand so as to allow selection of an appropriate filter in accordance with the type of the effective light source to be defined, to meet two types of effective light sources such as described with reference to FIGS. 6A and 6B. On that occasion, in order to prevent an error in connection with the setting up of the filter 60, an identification mark such as a bar code may preferably be recorded on each filter. This enables automatic recognition of filters based on identification marks, by which upon replacement of filters the type of the filter to be used can be checked by the computer which is provided to control the operation of the stepper as a whole. This is also the case with the selection of illumination mode in the illumination system (i.e., the selection of stops 20a–20d of the effective light source selecting member 20, or selection of the lens system). Particularly, when a dual-peak type effective light source is to be defined, any mismatching of the positions of selected two portions of the effective light source with the filter setting position causes degradation of image performance. Thus, this checking has a significance.

Figure 16A:
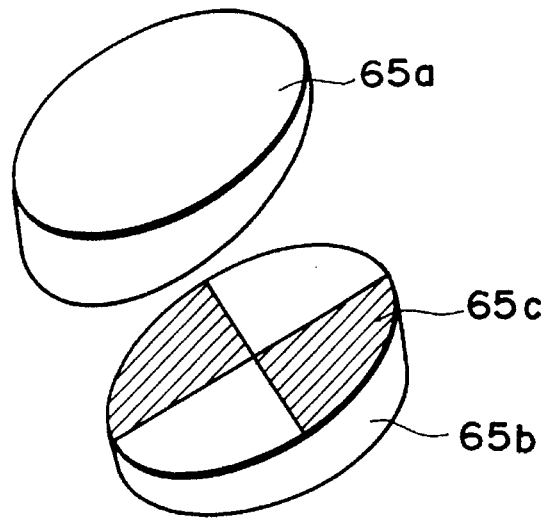
Figure 16B:
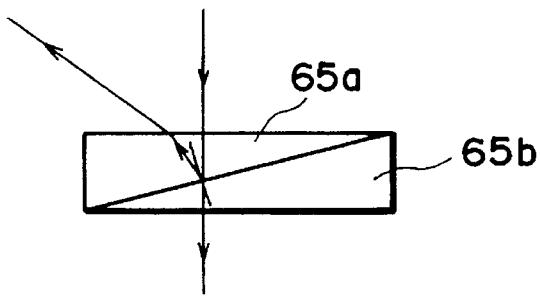

The filtering through the filter 60 may be attained by known means, e.g., by forming on a glass substrate a light absorbing film such as chromium or a semi-transparent film such as a dichroic film. A possible alternative form is to provide the filter by two wedged elements wherein a dichroic film is formed on the slant surface of one wedge element and wherein unwanted light reflected is directed to a position outside the patterned surface of the reticle 41 of the projection optical system 42 or outside the effective zone of the surface of the wafer 43. FIGS. 16A and 16B show such an example where an attenuation filter is provided by two wedge elements. More specifically, the attenuation filter is composed of two prisms 65a and 65b which are cemented with each other at their slant surfaces. Thus, they function as a parallel flat plate. Dichroic film 65c having a predetermined reflection characteristic is formed on the slant surface of the prism 65b. The light reflected by this slant surface emanates from the attenuation filter, with a large angle such as depicted in FIG. 16B, and is directed to an outside region, outside the effective area on the reticle or wafer, or outside the effective diameter of the projection optical system. The inclination of the slant surfaces of the two prisms 65a and 65b are set to assure this. A dichroic film is used because it shows relatively small light absorption.

When in the projection exposure apparatus of this embodiment the stops 20a and 20d of the effective light source selecting member 20 as well as the attenuation filter 60 are selected to illuminate the circuit pattern of the reticle 41, a secondary light source having a light quantity distribution such as shown in FIG. 6A or 6B is formed at the position of the stop of the effective light source selecting member 20, which position is conjugate with the pupil of the projection optical system 42. The circuit pattern of the reticle 41 is illuminated obliquely with two lights from this secondary light source. The directions of X and Y axes of X-Y coordinates having an origin taken on the position on the plane of the secondary light source whereat the optical axis extends therethrough, correspond to the directions of X and Y axes of the X-Y coordinates of the pupil of the projection optical system 42, respectively. Namely, the X and Y axes of the X-Y coordinates of the plane on which the secondary light source is formed, correspond to the directions along which the longitudinal line group and the transverse line group of the circuit pattern of the reticle 41, respectively. The secondary light source has a light quantity distribution having highest quantity portions (dual-peaks) at two sites along a direction perpendicular to the direction of elongation of oblique lines, among the oblique lines extending in the +45 deg. or −45 deg. direction and longitudinal and transverse lines, all constituting the circuit pattern. Thus, the lights from these two sites of the secondary light source advance along a pair of light paths which are symmetric with each other with respect to the plane of incidence which contains the direction of elongation of the oblique lines of the reticle 41, and finally these lights illuminate the reticle obliquely. Then, zeroth order light and first order light produced, from the two lights, by the circuit pattern of the reticle 41 enter the pupil of the projection optical system 42. The zeroth order light is attenuated by the filter 60 at the pupil position, whereby the intensities of the zeroth order light and first order light become substantially equal to each other. These lights are directed to the wafer, and an image of the circuit pattern is formed thereon. With such illumination and filtering as described above, the fine circuit pattern of the reticle 41 can be imaged on the wafer 43, with high resolution.

Figure 17:
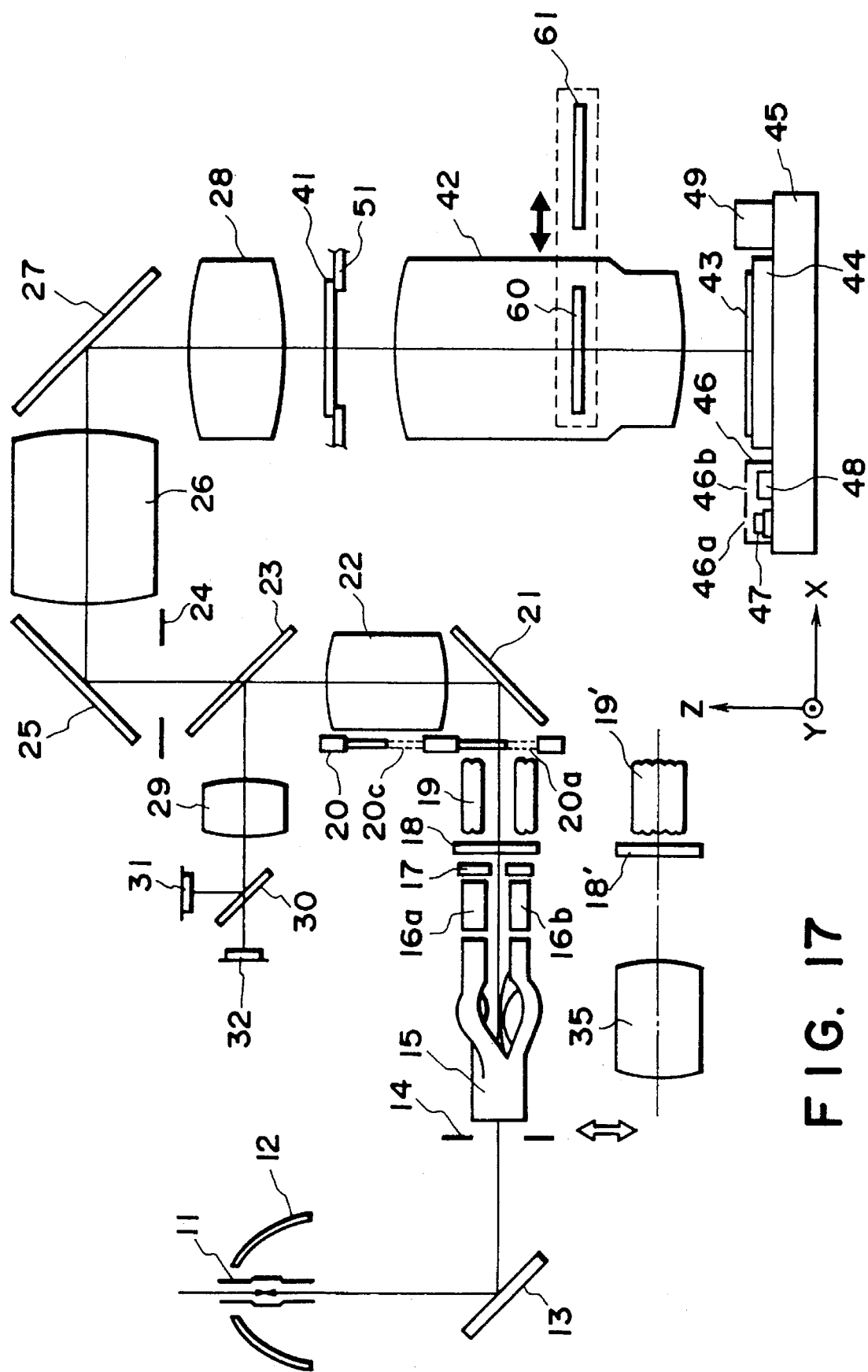
FIG. 17 is a schematic view of an example where an attenuation filter is added to the projection exposure apparatus of FIG. 11.

FIG. 17 shows an example where the projection exposure apparatus of FIG. 11 is provided with a filtering function. Attenuation filter 60 and parallel flat plate 61 as well as the manner of interchanging them in the apparatus of FIG. 17, are essentially the same as those of the FIG. 15 apparatus.

Figure 18:
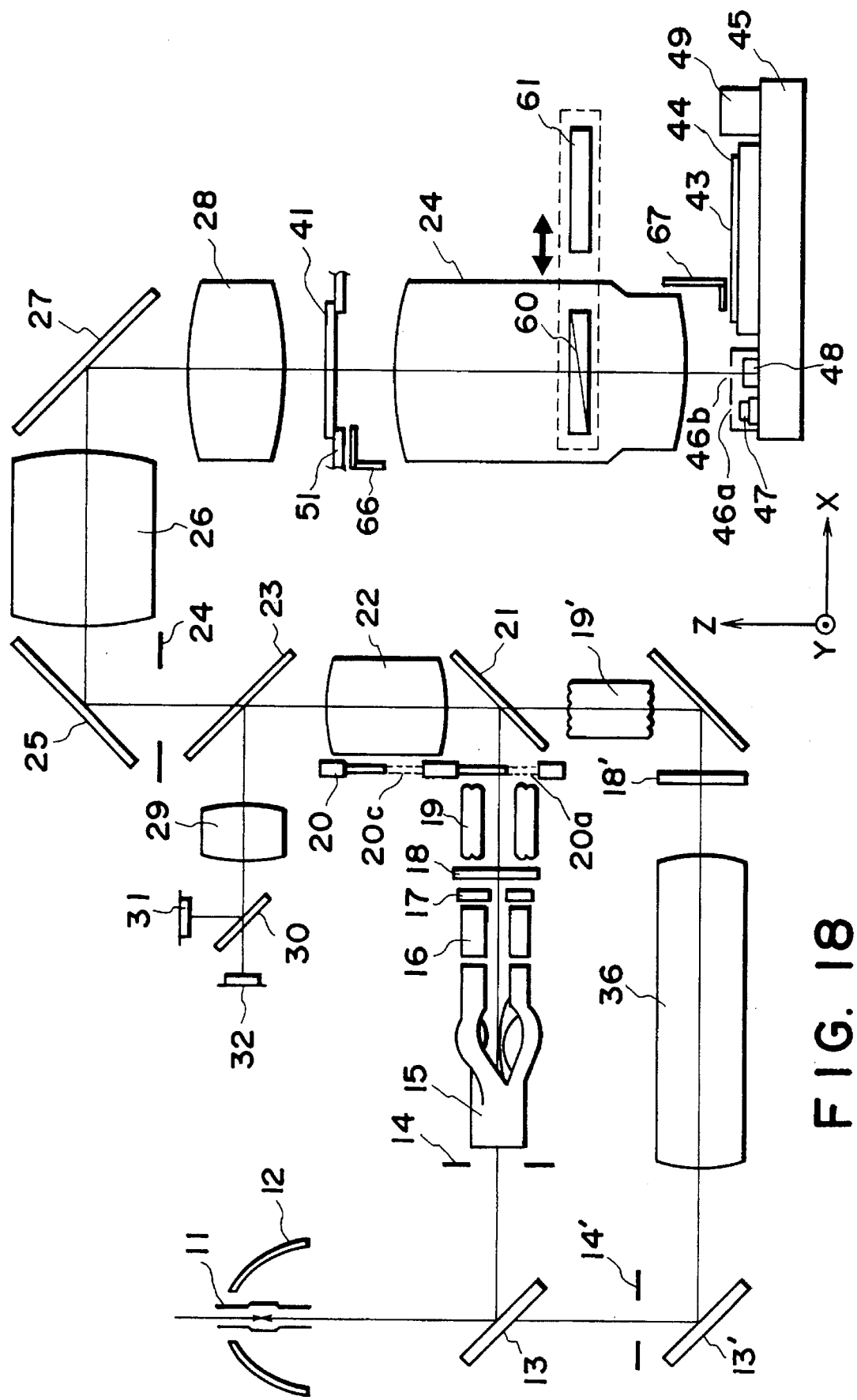
FIG. 18 is a schematic view of an example where an attenuation filter is added to the projection exposure apparatus of FIG. 12.

FIG. 18 shows an example where the projection exposure apparatus of FIG. 12 is provided with a filtering function. Attenuation filter 60 and parallel flat plate 61 as well as the manner of interchanging them in the apparatus of FIG. 18, are essentially the same as those of the FIG. 15 apparatus. Further, in the apparatus of this example, the attenuation filter 60 inserted to the pupil position of the projection optical system 42 is of the cemented wedge type as shown in FIG. 16. In FIG. 18, denoted at 66 and 67 are baffles (light blocking members) for blocking unwanted reflection light from the filters which are disposed at the reticle 41 side and the wafer 43 side. The positions of the baffles 66 and 67 are determined on the basis of the orientation and magnitude of the wedge of the attenuation filter. The disposition of these baffles 66 and 67 as well as the attenuation filter 60 may be used in other examples of the imaging method wherein filtering is to be done at the pupil position of a projection optical system.

Next, description will be made of a preferable range of the inclination angle of the attenuation filter (prism) of FIGS. 16 and 18. The filter 60 is disposed at the pupil position of the projection optical system 42. Thus, as long as the filter 60 is set in the projection optical system 42, the principal ray of the imaging light at each image height all passes through the center of the filter 60. In order to determine the condition for the inclination angle of the filter, it is now assumed that the imaging light on the axis enters the filter as parallel light. Actually, the light is not always parallel light. However, since the condition in the case of parallel light is the condition for the minimum inclination angle, now the case of parallel light is considered.

Figure 19:
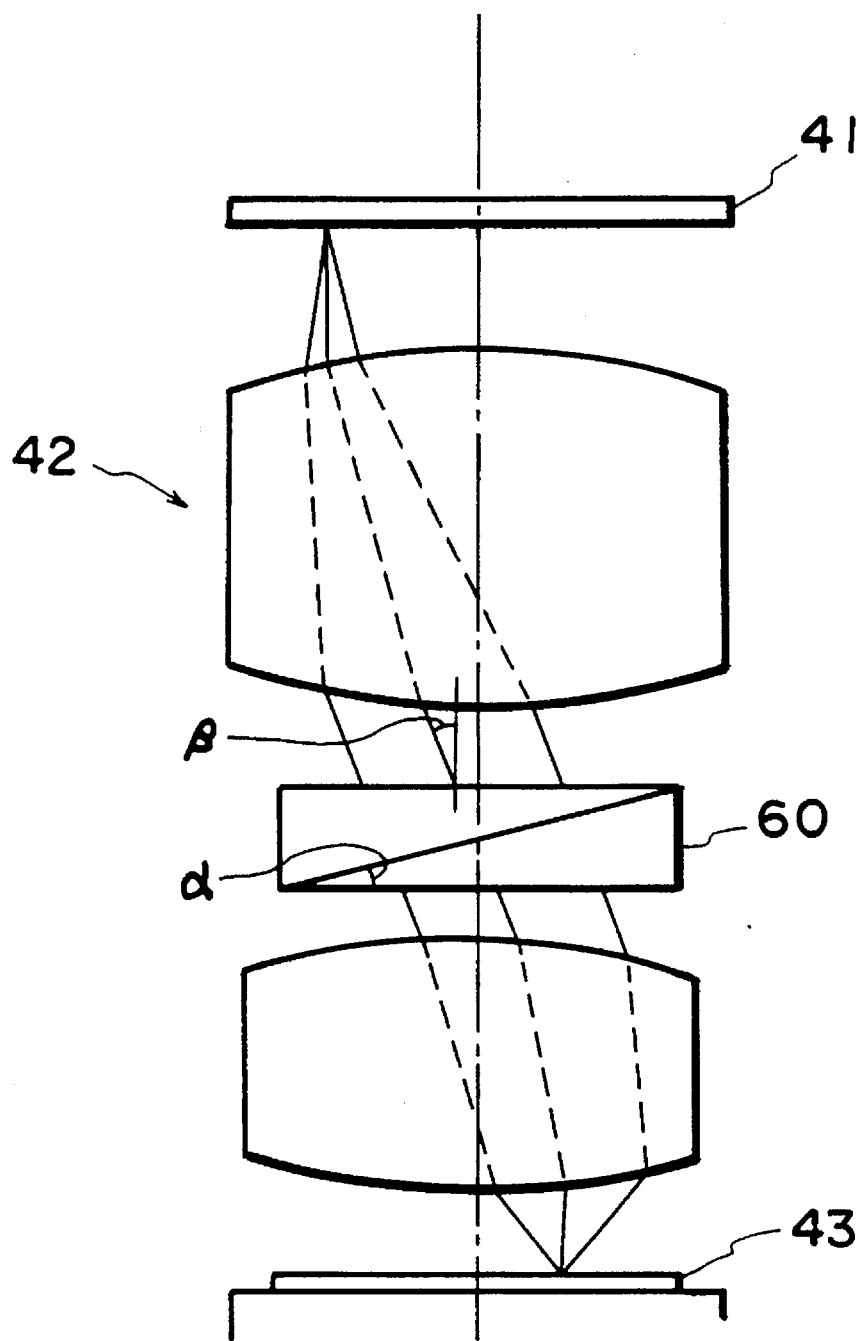
FIG. 19 is a schematic view for explaining a preferred form of an attenuation filter.

FIG. 19 is a schematic view for explaining how to determine a preferable inclination angle. The sectional view of this drawing illustrates the angle of prism 60 as being correctly projected on the two-dimensional plane (sheet of the drawing). The inclination angle is denoted by $\alpha$ and the refractive index of a glass material used is n. In this sectional view, the angle of incidence on the prism 60 of the principal ray of the imaging light, entering from the outmost off-axis position (highest image height position) is denoted by $\beta$. The reflection light from the slant surface of the prism 60 coated with a dichroic film is unwanted light in connection with the regular imaging. This unwanted light goes back to the reticle 41 side. While this reflection light illuminates the reticle 41 from the projection optical system 42 side, if the light is reflected by the reticle and enters again the projection optical system 42, then it may go along the same path as that of the regular light and impinges on the wafer 43. Since the light reflected by any chromium area of the reticle is the light which should normally be absorbed by the chromium material, it should normally be blocked by the chromium material. Thus, this means that unwanted light impinges on the wafer 43, and it results in flare which adversely affects the imaging performance. It is seen therefore that one condition to α is that the light reflected by the prism 60 back to the reticle 41 does not impinge upon the effective region of the reticle 41.

This is also the case with the wafer 43 side. That is, light reflected by the wafer may be reflected by the slant surface of the prism 60 back to the wafer 43. In this case, the image inverted by reflection by the prism is formed, overlapping upon the regular image. Thus, the image performance degrades considerably. It is therefore necessary that light reflected by the wafer 43 and then reflected by the filter 60 is prevented from impinging upon the wafer.

In order to exclude such reflection light from the reticle 41 and reflection light from the wafer 43, in addition to the blocking members 66 and 67, the following condition is necessary with respect to α:

$$n\alpha > \sin\beta$$

If the magnitude of α is too large, the thickness of the parallel flat plate to be inserted to the pupil of the projection optical system 42 becomes too large, causing limitation to the design of the projection optical system 42. Practically, the magnitude of α is not larger than 30 deg.

The light blocking members 66 and 67 are provided to absorb the light reflected by the dichroic film of the filter 60. The member 66 is disposed between the reticle 41 and the projection optical system 42, and just below the reticle 41. The member 67 is disposed between the wafer 43 and the projection optical system, and just before the wafer. Of course, the blocking members may be disposed at other positions inside the projection optical system, provided that they can block unwanted reflection light from the filter 60. The position of each light blocking member is located in the quadrant in which the optical axis of the projection optical system is reflected by the wedge reflection surface of the filter 60, if the Y axis is taken on the optical axis of the projection optical system and the X axis is taken on a line passing through the center of the filter and extending perpendicularly to the optical axis of the projection optical system. In the example of FIG. 18, the member 66 is located in the second quadrant, while the member 67 is located in the fourth quadrant. The members 66 and 67 serve to absorb unwanted reflection light from the filter, and they are made of a material (e.g., a material of blade color) effectively absorbing the exposure light, to avoid any possibility of providing a secondary light emission source. Of course, not only provided for the light absorption, but they also may be one effective to reflect unwanted light from the filter 60, toward the outside of the projection optical system.

With this blocking of unwanted light, no flare is contained in the image formed on the wafer such that it has an increased contrast. Further, if a highest uniformness in illuminance is required as in the case of the manufacture of CCDs, avoiding the flare advantageously results in a corresponding increase in uniformness of illuminance.

The projection exposure apparatuses such as described with reference to FIGS. 15–19 each includes a single super high pressure Hg lamp of well-known type. However, plural light sources may be used in the present invention. For example, in the apparatus of FIG. 12, separate light sources may be used for the interchangeable upper and lower light paths.

The present invention is applicable also to a case where an excimer laser is used as a light source. When an illumination system includes an excimer laser, in place of using a fiber bundle, a scanning system may be used to scan the optical integrator with a laser light. When the range of scan is controlled by using a known type scanning means, it is easy to provide an effective light source such as shown in FIG. 6A or 6B.

Further, the position of the effective light source selecting member 20 may be separate from the optical integrator. For example, the member is able to function as a stop even if it is placed at a position within the illumination optical system, which position is away from the optical integrator and which is conjugate with the pupil of the projection optical system.

It is to be noted that the imaging method of the present invention is applicable to a step-and-repeat type exposure apparatus, a step-and-scan type exposure apparatus, an exposure apparatus having a projection optical system composed only of a lens assembly, or an exposure apparatus having a projection optical system composed of a mirror assembly only or of a combination of lenses and mirrors.

Next, an embodiment of manufacturing semiconductor devices on the basis of an exposure apparatus such as described hereinbefore will be explained.

Figure 20:
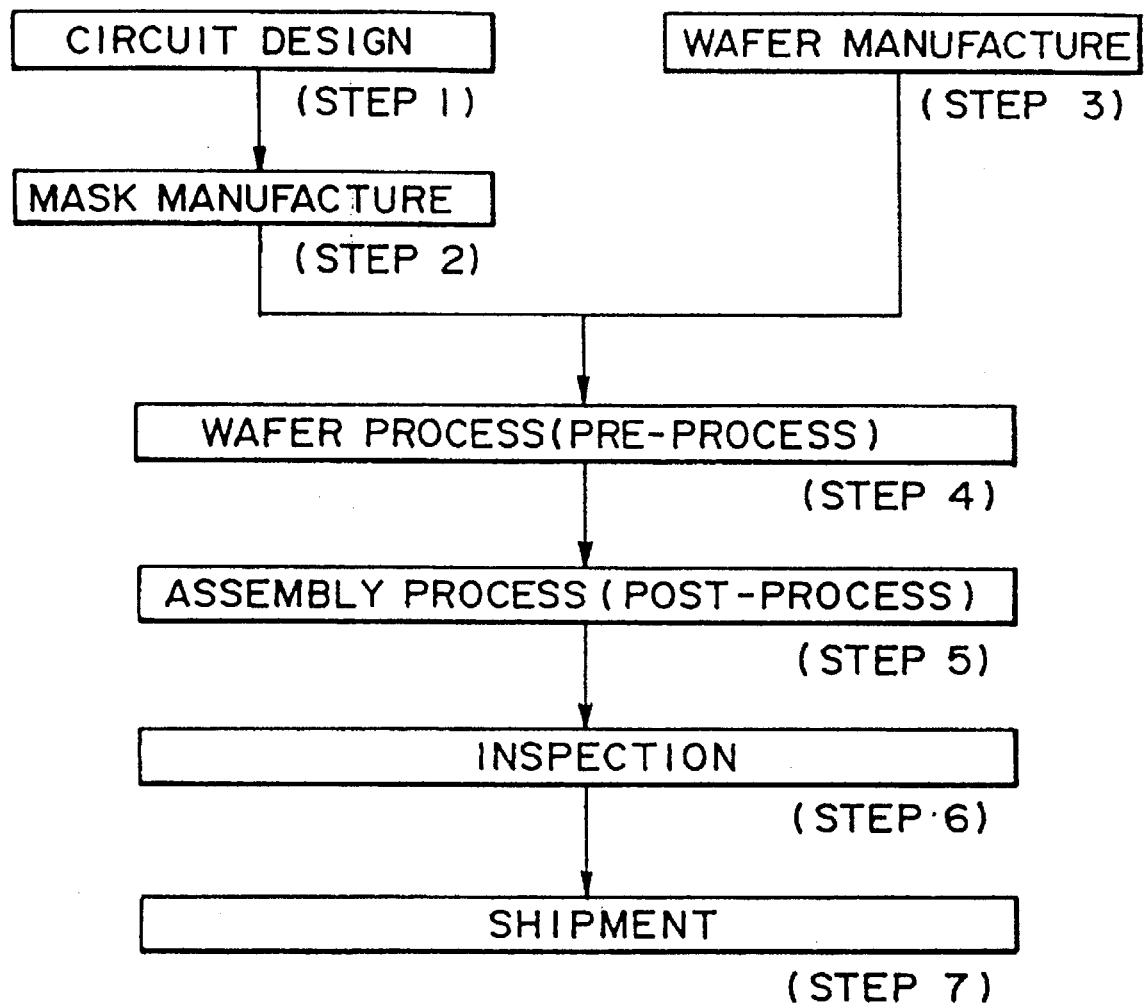
FIG. 20 is a flow chart for explaining semiconductor device manufacturing processes.

FIG. 20 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 21:
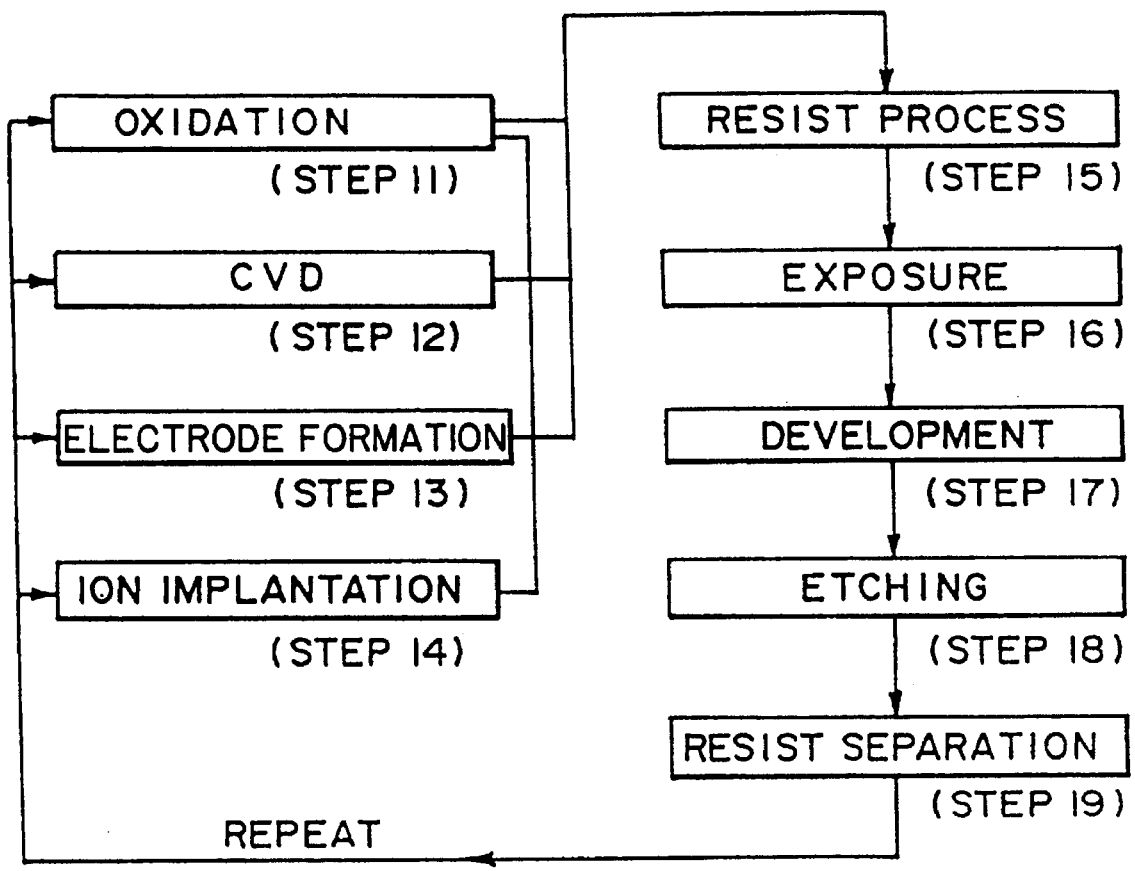
FIG. 21 is a flow chart for explaining a wafer process.

FIG. 21 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The present invention is applicable similarly to the manufacture of a CCD device, a magnetic head or an LCD device, for example.

While the invention has been described with reference to the structures disclosed herein, it is not confined to the details set forth and this application is intended to cover such modifications or changes as may come within the purposes of the improvements or the scope of the following claims.

What is claimed is:

1. An imaging method, comprising the steps of:
providing a fine pattern on a predetermined plane, the fine pattern having a group of lines extending along orthogonal first and second directions and a group of lines extending along a third direction different from the first and second directions; and
obliquely illuminating the fine pattern to form an image of the fine pattern, wherein illumination beams along the first, second and third directions, respectively, each has an intensity sufficiently lowered as compared with that of a particular illumination beam along a particular direction different from the first, second and third directions.

2. A method according to claim 1, wherein the illumination beams along the first, second and third directions, respectively, each has an intensity lowered substantially equal to zero.

3. A method according to claim 1 or 2, wherein the third direction has an azimuth of about 45 degrees with respect to the first and second directions, and wherein the particular illumination beam is projected along a pair of light paths which are symmetric with each other with respect to a particular plane that includes the third direction and a direction perpendicular to the predetermined plane on which the fine pattern is provided.

4. A method according to claim 3, wherein the particular illumination beam forms an effective light source at a pupil plane of an imaging optical system, and wherein, when the effective light source has a center coordinate (X, Y) and when a radius of the pupil plane is 1, the following relations are satisfied:

$$0.25 \leq |X|, |Y| \leq 0.6$$

when the coordinate of the pupil plane is set with its center being taken as an origin, with the first direction being taken as an X axis and with the second direction being taken as a Y axis.

5. A device manufacturing method, comprising the steps of:
providing a fine pattern on a predetermined plane, the fine pattern having a group of lines extending along orthogonal first and second directions and a group of lines extending along a third direction different from the first and second directions; and
obliquely illuminating the fine pattern to form an image of the fine pattern on a workpiece, wherein illumination beams along the first, second and third directions respectively, each has an intensity sufficiently lowered as compared with that of a particular illumination beam along a particular direction different from the first, second and third directions.

6. A method according to claim 5, wherein the illumination beams along the first, second and third directions, respectively, each has an intensity lowered substantially equal to zero.

7. A method according to claim 5 or 6, wherein the third direction has an azimuth of about 45 degrees with respect to the first and second directions, and wherein the particular illumination beam is projected along a pair of light paths which are symmetric with each other with respect to a particular plane that includes the third direction and a direction perpendicular to the predetermined plane on which the fine pattern is provided.

8. A method according to claim 7, wherein the particular illumination beam forms an effective light source at a pupil plane of an imaging optical system, and wherein, when the effective light source has a center coordinate (X, Y) and when a radius of the pupil plane is 1, the following relations are satisfied:

$$0.25 \leq |X|, |Y| \leq 0.6$$

when the coordinate of the pupil plane is set with its center being taken as an origin, with the first direction being taken as an X axis and with the second direction being taken as a Y axis.

9. An exposure apparatus comprising:
a first stage for carrying thereon an original;
a second stage for carrying thereon a substrate and being movable in orthogonal X and Y directions;
illuminating means for obliquely illuminating a fine pattern of the original along a plane of incidence; and
means for imaging on the substrate the fine pattern illuminated by said illuminating means,
wherein said illuminating means comprises light limiting means for sufficiently lowering the intensity of illumination beams along the X and Y directions and a direction having an azimuth of 45 degrees with respect to the X and Y directions, as compared with the intensity of a particular illumination beam along a particular direction different from each of the X and Y directions and the direction having an azimuth of 45 degrees with respect to the X and Y directions.

10. An apparatus according to claim 9, wherein said light limiting means lowers, substantially equal to zero, the intensity of illumination beams along the plane of incidence, including the direction having an azimuth of 45 degrees with respect to the X and Y directions.

11. An apparatus according to claim 10, wherein said light limiting means comprises light blocking means having two openings which are symmetric with each other with respect to the optical axis.

12. An apparatus according to claim 11, wherein the particular illumination beam forms an effective light source at a pupil plane of an imaging optical system, and wherein, when the effective light source has a center coordinate (X, Y) and when a radius of the pupil plane is 1, the following relations are satisfied:

$$0.25 \leq |X|, |Y| \leq 0.6$$

when the coordinate of the pupil plane is set with its center being taken as an origin, with the first direction being taken as an X axis and with the second direction being taken as a Y axis.

13. An apparatus according to claim 12, further comprising an adjusting member for adjusting intensity of light emerging from the two openings of said light blocking means.

14. An apparatus according to claim 13, further comprising a detector for detecting intensity of light emerging from the two openings of said light blocking means, wherein said adjusting member adjusts the light intensity based on the detection by said detector.

15. An image method comprising the steps of:
providing a fine pattern on a predetermined plane, the fine pattern having a group of lines extending along orthogonal first and second directions; and obliquely illuminating the fine pattern to form an image of the fine pattern, wherein illumination beams along the first and second directions each has an intensity sufficiently lowered as compared with that of a particular illumination beam along a direction different from the first and second directions, and a zeroth order diffraction beam produced by the fine pattern from the particular illumination beam has an intensity which is attenuated.

16. A method according to claim 15, wherein the illumination beams along the first and second directions, respectively, each has an intensity substantially equal to zero.

17. A method according to claims 15 or 16, wherein the particular illumination beam is projected along a pair of light paths which are symmetric with each other with respect to a particular plane that includes a direction perpendicular to the predetermined plane on which the fine pattern is provided, and a third direction having an azimuth of about 45 degrees with respect to the first and second directions.

18. A method according to claim 15, wherein a portion of the zeroth order diffraction beam is reflected by a reflecting member, by which the intensity of the zeroth order diffraction beam is attenuated.

19. A method according to claim 18, wherein the reflecting member comprises a prism-shaped member.

20. A device manufacturing method comprising the steps of:

providing a fine pattern on a predetermined plane, the fine pattern having a group of lines extending along orthogonal first and second directions; and obliquely illuminating the fine pattern to form an image of the fine pattern, wherein illumination beams along the first and second directions each has an intensity sufficiently lowered as compared with that of a particular illumination beam along a direction different from the first and second directions, a zeroth order diffraction beam produced by the fine pattern from the particular illumination beam has an intensity which is attenuated and the zeroth order diffraction and a first order diffraction beam also produced by the fine pattern have substantially the same intensity.

21. A method according to claim 20, wherein the illumination beams along the first and second directions, respectively, and has an intensity substantially equal to zero.

22. A method according to claim 20 or 21, wherein the particular illumination beam is projected along a pair of light paths which are symmetric with each other with respect to a particular plane that includes a direction perpendicular to the predetermined plane on which the fine pattern is provided, and a third direction having an azimuth of about 45 degrees with respect to the first and second directions.

23. A method according to claim 20, wherein a portion of the zeroth order diffraction beam is reflected by a reflecting member, by which the intensity of the zeroth order diffraction beam is attenuated.

24. A method according to claim 23, wherein the reflecting member comprises a prism-shaped member.

25. An exposure apparatus comprising:

a first stage of carrying thereon an original;

a second stage for carrying thereon a substrate and being movable in orthogonal X and Y directions;

illuminating means for obliquely illuminating a fine pattern of the original; and means for imaging on the substrate the fine pattern illuminated by said illuminating means, wherein said illuminating means comprises light limiting means for sufficiently lowering the intensity of illumination beams along the X and Y directions, as compared with the intensity of an illumination beam in another direction, and wherein said imaging means comprises a stop and light attenuating means disposed adjacent to said stop for attenuating the intensity of a zeroth order diffraction beam produced by the illumination along the other direction, such that the zeroth order diffraction beam and a first order diffraction beam also produced by the illumination have substantially the same intensity.

26. An apparatus according to claim 25, wherein said light limiting means lowers substantially equal to zero, the intensity of illumination beams along the plane of incidence, including the direction having an azimuth of 45 degrees with respect to the X and Y directions.

27. An apparatus according to claim 26, wherein said light limiting means comprises light blocking means having two openings which are symmetric with each other with respect to the optical axis.

28. An apparatus according to claim 24, wherein said light attenuating means comprises two attenuating members which are symmetric with each other with respect to the optical axis and which attenuate the intensity of each of zeroth order diffraction beams, produced from said two openings of said light limiting means, respectively, in response to the illumination.

29. An apparatus according to claim 25, wherein said light attenuating means comprises a reflecting member for reflecting a portion of the zeroth order diffraction beam.

30. An apparatus according to claim 29, wherein said reflecting member comprises a prism-shaped member.

31. An imaging method for imaging a first group of lines and a second group of lines, said method comprising the steps of:

illuminating the first group of lines with a first beam; and obliquely illuminating the second group of lines with a second beam having a bandwidth greater than that of the first beam.

32. A method according to claim 31, wherein, for imaging the second group of lines, the intensity of a particular position of the second beam, along a direction of the second group of lines, is sufficiently lowered as compared with that of another portion of the second beam, along a direction different from the direction of the second group of lines.

33. A method according to claim 32, wherein the intensity of the particular portion of the second beam is substantially equal to zero.

34. A device manufacturing method comprising steps of:

imaging on a workpiece a first group of lines and a second group of lines having a linewidth smaller than that of the first group of lines by using an illumination beam formed by adjusting a bandwidth of a radiation beam by using an imaging lens;

imaging the first group of lines, by illuminating the first group of lines perpendicularly; and imaging the second group of lines, by illuminating the second group of lines obliquely with a beam having a bandwidth larger than that of the beam used for illuminating the first group of lines.

35. A method according to claim 34, wherein, for imaging the second group of lines, the intensity of a particular portion of the second beam, along a direction of the second group of lines, is sufficiently lowered as compared with that of another portion of the second beam, along a direction different from that of the second group of lines.

36. A method according to claim 35, wherein the intensity of the particular portion of the second beam is substantially equal to zero.

37. An exposure apparatus comprising:

a first stage for carrying thereon an original;

a second stage for carrying thereon a substrate and being movable in orthogonal X and Y directions;

illuminating means for obliquely illuminating a fine pattern of the original; and imaging means comprising an imaging lens, for imaging on the substrate the fine pattern illuminated by said illuminating means, wherein said illuminating means comprises (i) a radiation source for producing a radiation beam, (ii) bandwidth adjusting means for receiving the radiation beam from said radiation source and for providing a first illumination beam and a second illumination beam having a bandwidth wider than that of the first illumination beam, and (iii) angle adjusting means for adjusting an angle of incidence of the first illumination beam and the second illumination beam so that the first illumination beam is projected along an optical axis onto the original while the second illumination beam is projected onto the original along a direction inclined with respect to the optical axis.

38. A method of imaging a fine pattern on a substrate by projecting a diffraction beam, produced by the fine pattern, onto a pupil of an imaging optical system, said method comprising the steps of:

illuminating the fine pattern to produce a diffraction beam;

reflecting a portion of the diffraction beam to thereby adjust the intensity distribution of the diffraction beam at the position of the pupil; and blocking the portion of the diffraction beam to substantially prevent the blocked portion of the diffraction beam from illuminating the substrate.

39. A method according to claim 38, further comprising producing the diffraction beam as a result of oblique illumination of the fine pattern.

40. A method according to claim 38, wherein said blocking step uses a baffle.

41. A device manufacturing method comprising steps of:

imaging a fine pattern on a substrate by projecting a diffraction beam produced by the fine pattern onto a pupil of an imaging optical system;

reflecting a portion of the diffraction beam to thereby adjust an intensity distribution of the diffraction beam at the position of the pupil; and blocking a reflected beam produced by the reflection to substantially prevent the blocked reflected beam from being incident on the substrate.

42. A method according to claim 41, further comprising producing the diffraction beam as a result of oblique illumination of the fine pattern.

43. A method according to claim 41, wherein said blocking step uses a baffle.

44. An exposure apparatus comprising:

a first stage for carrying thereon an original a second stage for carrying thereon a substrate;

illuminating means for illuminating a fine pattern of the original; and imaging means comprising an imaging optical system, for imaging on the substrate the fine pattern illuminated by said illuminating means, wherein said imaging means comprises (i) light attenuating means for reflecting a portion of a diffraction beam produced by illumination of the fine pattern to adjust an intensity distribution of the diffraction beam at a position of a stop of said imaging means, and (ii) blocking means for blocking a reflected beam from said attenuating means to prevent the reflection beam from being incident on the substrate.

45. An apparatus according to claim 44, wherein said blocking means comprises a first blocking member disposed between said first stage and said imaging optical system, and a second blocking member disposed between said second stage and said imaging optical system.

46. An apparatus according to claim 44, wherein said light attenuating means comprises a parallel flat plate having a beam input and output surface perpendicular to an optical axis of said imaging optical system, and wherein said parallel flat plate comprises two cemented prisms having a reflection mirror surface formed at an interface therebetween.

47. An apparatus according to claim 46, wherein the following relationship is satisfied:

$$(1/n)\sin\beta < \alpha \leq 30$$

where $\alpha$ is an angle of the interface with respect to the beam input and output surface, $\beta$ is an angle of incidence, upon the beam input and output surface, of a chief ray of imaging light of largest image height which impinges on the substrate, and n is a refractive index of the two prisms.

48. An apparatus according to claim 44, wherein said blocking means comprises a baffle.

49. An apparatus according to claim 44, wherein said illuminating means has a first illumination mode in which the original is illuminated along an oblique direction and a second mode in which the original is illuminated from just above, wherein the first and second illumination modes are interchangeable with each other, said attenuating means is demountably mountable at a position adjacent to said stop, said attenuating means is mounted at the adjacent position when the first illumination mode is set, and said apparatus further comprises a transparent parallel plate to be mounted at the adjacent position in place of said attenuating means when the second illumination mode is set.

50. A method of imaging a fine pattern on a substrate by projecting a diffraction beam, produced by the fine pattern, onto a pupil of an imaging optical system, said method comprising the steps of:

illuminating the fine pattern to produce a diffraction beam; and reflecting a portion of the diffraction beam to thereby adjust the intensity distribution of the diffraction beam at the position of the pupil.

51. A method according to claim 50, further comprising producing the diffraction beam as a result of oblique illumination of the fine pattern.

52. A device manufacturing method comprising the steps of:

imaging a fine pattern on a substrate by projecting a diffraction beam produced by the fine pattern onto a pupil of an imaging optical system; and reflecting a portion of the diffraction beam to thereby adjust an intensity distribution of the diffraction beam at the position of the pupil.

53. A method according to claim 51, further comprising producing the diffraction beam as a result of oblique illumination of the fine pattern.

54. An exposure apparatus comprising:

a first stage for carrying thereon an original;

a second stage for carrying thereon a substrate;

illuminating means for illuminating a fine pattern of the original; and imaging means comprising an imaging optical system, for imaging on the substrate the fine pattern illuminated by said illuminating means, wherein said imaging means comprises light attenuating means for reflecting a portion of a diffraction beam produced by illumination of the fine pattern to adjust an intensity distribution of the diffraction beam at a position of a stop of said imaging means.

* * * * *

UNITED STATES PATENT AND TRADEMARK OFFICE
CERTIFICATE OF CORRECTION

PATENT NO. : 5,574,492
DATED : November 12, 1996
INVENTOR(S) : Akiyoshi SUZUKI

It is certified that error appears in the above-indentified patent and that said Letters Patent is hereby corrected as shown below:

ON THE COVER PAGE

Under "OTHER PUBLICATIONS":

In "Fukuda et al.", "1990 Jul." should read --1990, Jul.--.

COLUMN 1:

Line 37, "as" should read --a--;
Line 62, "film:" should read --film;--;
Line 65, "film:" should read --film;--; and
Line 67, "applied:" should read --applied;--.

COLUMN 2:

Line 2, "Item 3):" should read --Item (3);--.

COLUMN 6:

Line 50, "on" should read --on a--; and
Line 54, "of" (first occurrence) should read --of the--.

UNITED STATES PATENT AND TRADEMARK OFFICE
CERTIFICATE OF CORRECTION

PATENT NO.   : 5,574,492
DATED        : November 12, 1996
INVENTOR(S)  : Akiyoshi SUZUKI It is certified that error appears in the above-indentified patent and that said Letters Patent is hereby corrected as shown below:

COLUMN 16:

Line 17, "that" should read --that of--.

COLUMN 19:

Line 5, "in" should read --in a--; and
  Line 53, "one" should be deleted.

COLUMN 24:

Line 19, "claim 24," should read --claim 27,--.

COLUMN 25:

Line 58, "original" should read --original;--.

Signed and Sealed this

Twentieth Day of May, 1997

Attest:

BRUCE LEHMAN

*Attesting Officer*                *Commissioner of Patents and Trademarks*